(12) United States Patent
Imanishi et al.

(10) Patent No.: US 6,619,535 B1
(45) Date of Patent: Sep. 16, 2003

(54) WORKING METHOD FOR HOLDING A WORK OBJECT BY SUCTION

(75) Inventors: Makoto Imanishi, Neyagawa (JP); Takahiro Yonezawa, Neyagawa (JP); Shinji Kanayama, Kashihara (JP); Ryoichiro Katano, Hirakata (JP); Takaharu Mae, Hirakata (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/830,508

(22) PCT Filed: Oct. 28, 1999

(86) PCT No.: PCT/JP99/05965
§ 371 (c)(1),
(2), (4) Date: Apr. 27, 2001

(87) PCT Pub. No.: WO00/25360
PCT Pub. Date: May 4, 2000

(30) Foreign Application Priority Data

Oct. 28, 1998 (JP) .............................. 10-306742
Sep. 6, 1999 (JP) ........................... 11-251273

(51) Int. Cl.$^7$ .......................... B23K 31/02; B23K 1/06; B23K 37/04
(52) U.S. Cl. ................. 228/180.22; 228/212; 228/49.5; 228/110.1
(58) Field of Search .......................... 228/1.1, 4.5, 254, 228/110.1, 212, 180.1–180.5, 49.1, 49.5; 29/56, 559, 739–741; 257/737, 738; 438/613, 617

(56) References Cited

U.S. PATENT DOCUMENTS 6,302,317 B1 * 10/2001 Narita et al. ................ 228/254

FOREIGN PATENT DOCUMENTS

| JP | 63-64346 | 3/1988 |
| JP | 2-504487 | 12/1990 |
| JP | 4-350950 | 12/1992 |
| JP | 5-082565 | 4/1993 |
| JP | 6-342797 | 12/1994 |
| JP | 10-064958 | 3/1998 |

* cited by examiner

Primary Examiner—M. Alexandra Elve
Assistant Examiner—Kevin McHenry
(74) Attorney, Agent, or Firm—Wenderoth, Lind & Ponack, L.L.P.

(57) ABSTRACT

Provided is a construction including a stage having a suction hole for sucking an electronic component and fixing the same in position and position regulating suction hole for sucking an electronic component when the electronic component is regulated in position, a position regulating pawl for positioning the electronic component on the stage and a position regulating suction force control section capable of controlling a position regulating suction force when the electronic component is regulated in position on the stage.

10 Claims, 15 Drawing Sheets

S1 — STRONG SUCTION START

S2 — ELECTRONIC COMPONENT PLACING

S3 — STRONG SUCTION → WEAK SUCTION

S4 — ELECTRONIC COMPONENT REGULATING

S5 — WEAK SUCTION → STRONG SUCTION

S6 — RELEASE REGULATION

S11 — STRONGLY REGULATED SUCTION START

S12 — ELECTRONIC COMPONENT PLACING

S13 — STRONGLY REGULATED SUCTION → WEAKLY REGULATED SUCTION

S14 — ELECTRONIC COMPONENT REGULATING

S15 — SUCTION START FOR FIXING

S16 — RELEASE REGULATION

WORKING METHOD FOR HOLDING A WORK OBJECT BY SUCTION

BACKGROUND OF THE INVENTION

1. Technical Field

The present invention relates to a working method and apparatus for holding by suction a work object (for example, a semiconductor component such as an IC chip) to be placed on a work stage, moving the work object to a specified position, regulating the object in position, and thereafter subjecting the work object to specified work (for example, bump bonding work of bumps formed on an IC chip), and in particular, to a bump bonding working method and apparatus for holding by suction a work object of, for example, a semiconductor component such as an IC chip in which a semiconductor device is formed, to be placed on a work stage, moving the semiconductor component to a specified position, regulating the component in position, and thereafter subjecting the component to specified work such as bump bonding work of a bump that serves as a protruding electrode formed on an electrode of, for example, a semiconductor component: and an IC chip obtained through the processes.

2. Description of Related Art

Regarding semiconductor components such as the so-called IC chips and the like in which semiconductor elements having an integrated circuit are formed, in accordance with the miniaturization of electronic components, the compacting of a circuit board, increasing integration density, and increasing mounting density on a circuit board, there is frequently adopted the so-called surface mounting for collecting electrodes on a surface to be mounted on a circuit board, electrically connecting face to face the electrodes to corresponding electrodes and conductor lands of the circuit board and concurrently bonding them together into an integrated body with solder or adhesive for mounting.

It has already been known to form metal bumps on the electrodes of an IC chip for this surface mounting and easily achieve individual electrical connections with the circuit board. The present applicant has previously provided and put into practical use a bump bonding method by means of a wire bonding method as a method for forming a metal bump.

The outline of this method will be explained with reference to FIG. 14 and FIGS. 5A through 5D. Using an IC chip 1 as a work object, this work presses a metal wire 3 against an electrode 2 of a surface 1a thereof with ultrasonic vibrations applied to the wire for the achievement of metallic bond as shown in FIGS. 5A through 5D and separates the succeeding metal wire 3 from a bonded metal lump 3a formed through the above process by tearing off or cutting by pushing the metal wire 3, forming a metal bump 4 on the electrode 2.

Specifically, FIG. 14 is a perspective view of a bump bonding apparatus for forming a bump on the IC chip 101 with a gold wire 113.

In FIG. 14, the IC chip 101 supplied from a tray 110 is held by suction by a suction nozzle 1111, thereafter moved by the suction nozzle 111 and fixed to an IC chip placement surface or, for example, the upper surface of a stage 151 that has a raised temperature. A capillary 112 is constructed so as to be held by an ultrasonic wave supply unit and receive ultrasonic waves, and a gold bump is formed on the electrode of the IC chip 101 by the capillary 112 through which the gold wire 113 is positioned. The IC chip 101 that has undergone bump formation in the required portions is held by suction by the suction nozzle 111 and stored in another tray 110a.

FIGS. 5A through 5D are process charts showing the bump forming process performed by the aforementioned conventional bump bonding apparatus.

First of all, in the process of FIG. 5A, a gold wire 3 is put through the capillary 34, and the tip of the gold wire 3 is sparked, forming a spherical ball portion 3a at the tip.

Next, in the process of FIG. 5B, the capillary 34 is lowered to press the spherical ball portion 3a located at the tip against the electrode 2 of the IC chip 1. At this time, ultrasonic waves are applied to bond the gold wire 3 to the electrode 2 (first bonding).

Next, in the process of FIG. 5C, the capillary 34 is moved up and moved down again while being controlled so as to move in a loop form. As shown in the process of FIG. 5D, the capillary 34 presses the gold lump that has undergone the first bonding, cutting the gold wire 3 (second bonding).

The following will describe in detail the position regulating section of the IC chip 1 of the aforementioned conventional bump bonding apparatus.

FIGS. 6, 15A, 15B and 15C are a flowchart of a position regulating operation and plan views of the position regulating section of the IC chip 1.

As shown in FIG. 15A, the position regulating section of the bump bonding apparatus is constructed of a stage 151 provided with four suction holes 157 and an L-figured position regulating pawl 152 that can move in XY-directions. The IC chip 1 is moved on the suction holes 157 of the stage 151 by the position regulating pawl 152 and regulated in position on the stage 151 while being sucked by vacuum. Describing this operation based on the flowchart, as shown in FIG. 13, suction is first turned on by a vacuum pump to start suction (step S51), and the IC chip 1 held by suction by the suction nozzle 111 is placed on the stage 151 of the bump bonding apparatus. The IC chip 1 is sucked by the suction holes 157 (step S52, see FIG. 15A), and the position regulating pawl 152 is moved on the stage 151 to regulate in position the IC chip 1 by means of a constant suction force (step S53, see FIG. 15B). That is, in this FIG. 15B, the IC chip 1 is first moved leftward by the position regulating pawl 152 and thereafter moved upward to perform positioning, and the IC chip 1 is held by suction by the four suction holes 157. Subsequently, after the IC chip 1 is positioned, the position regulating pawl 152 is moved back from the position of the solid line to the position of the one-dot chain line (step S53, see FIG. 15C), release regulation is performed (Step S54), and thereafter the IC chip 1 is bonded, according to the conventional practice (Step S55).

In attempting to further increase the speed and quality in practically using this wire bonding method and apparatus, the present applicant has found visible minute scratches on a surface 1b that belongs to the IC chip 1 and is located opposite from the mounting surface 1a on which the metal bumps 4 are formed for the bonding onto a circuit board or the like. Since the surface is to be noticed as the identification surface of the manufacturer name, article number, specifications and so on, such scratches are concerned with the quality in terms of the external appearance although the scratches lead to no functional defect. Depending on the size and depth of the scratches, it can be considered that the scratches would become the cause of chipping and cracking due to an impact or the like at the time of handling in various stages, and this has became an important issue.

The present inventor and others have conducted various experiments in order to solve this issue and discovered the following facts. To the stage 151 are adhering foreign objects such as processing dust occurring when dicing is performed for separation into individual IC chips 1, chipped segments generated during processing, conveying and various handling processes, dust in the air and so on, each having a particle diameter of two to several tens of micrometers. The processing dust and chip dust as described above are often hard substances of the grindstone that has performed dicing and those of the processed IC chips, having hardness equivalent to that of the IC chip 1. Therefore, when the IC chip 1 is regulated in position by being pushed from the placement position to the work position in a state in which it is sucked onto the work stage 151, the IC chip suffers scratches while being brought in strong abrasive contact with the foreign objects, occasionally causing chipping and cracking. That is, according to the aforementioned structure and method, the IC chip 1 is loaded with a suction force required for bonding from the suction holes 157 even when the IC chip 1 is regulated in position. Therefore, a heavy load is applied to the IC chip 1 when the IC chip 1 is moved in a contact portion where a peripheral portion of the IC chip 1 comes in contact with a peripheral portion of the position regulating pawl 152, and this has damaged the peripheral portion of the IC chip 1. Moreover, a great frictional force is exerted between the IC chip 1 and the stage 151, and this has inflicted damage on the IC chip 1. Moreover, the fragments of the damaged IC chip 1 remain on the stage 151, and this has aggravated the damage on the IC chip 1 placed subsequently. The above-mentioned issues have not been able to be removed in the conventional work environment of dicing work with washing in water, work inside a clean room and so on.

There are some IC chips 1 constructed of a single crystal semiconductor of silicon or the like or a compound semiconductor of gallium arsenide or the like. The silicon semiconductor is hard and tends to cause chipping and cracking. The compound semiconductor such as gallium arsenide is soft and tends to suffer scratches, and in addition, it is fragile and tends to incur chipping and cracking. On the other hand, the bump bonding work is performed with the IC chip 1 held by suction in the work position. Therefore, although the foreign objects scarcely cause scratches during the above work, a bonding temperature of not lower than 250° C. and the application of ultrasonic vibrations with a pressure of about 30 g exert influence. If a foreign object as described above is interposed between the IC chip and the work stage 151, then the IC chip 1 tends to incur chipping and cracking, and in addition, the ultrasonic vibrations themselves become hard to produce an effect, easily causing a bonding failure. Therefore, electronic components like semiconductor components such as IC chips are required to suffer a reduced impact force and a reduced load at the position regulating time, for the prevention of damage on the electronic components.

On the basis of the aforementioned knowledge, the present invention has the object of providing a working method and apparatus that ensures improved quality of the state of the product surface opposite from the mounting surface and are hard to cause chipping and cracking as well as a high-quality IC chip obtained by the method and apparatus.

SUMMARY OF THE INVENTION

In order to achieve the aforementioned object, the present invention has the following construction.

According to a first aspect of the present invention, there is provided A working method for holding by suction a work object placed on a work stage, moving the work object into a specified position, regulating in position the object, and thereafter subjecting the object to specified work, comprising:

receiving the work object to be placed on a work object placement surface of a roughened surface of the work stage; holding by suction the work object while supporting the work object with protruding portions of the roughened surface of the work object placement surface of the work stage;

thereafter changing an immovable state in which the object is held by suction into a movable state for positional regulation; and thereafter regulating in position the work object while stably moving the work object on the work stage in a frictional state obtained by supporting the work object with the prot ruding portions of the roughened surface of the work object placement surface of the work stage and while restraining strong abrasive movement of a foreign object between the work stage and the work object in moving the work object for positional regulation by pockets that are formed of recess portions around the protruding portions and let the foreign object escape.

In the above-mentioned construction, by holding by suction the work object placed on the work stage, the positional regulation of the work object from the receiving position to the specified position on the work stage is performed by the movement in the state in which the suction to the work stage is reduced or released while allowing the work object placed by a variety of methods to be securely received and accepted inclusive of the influence when the release of vacuum is delayed in conveying and placing the object held by suction by the suction nozzle. Therefore, no strong abrasion occurs even if a foreign object is interposed between the object and the work stage, and this prevents the surface of the work object put in contact with the work stage from suffering scratches, chipping or cracking, allowing the quality and yield of products to be improved.

According to a second aspect of the present invention, there is provided a working method as defined in the first aspect, wherein the movable state for positional regulation is a state in which the suction of the work object is reduced or released.

According to a third aspect of the present invention, there is provided a working method as defined in the first or second aspect, wherein the work object is regulated in position in the movable state for positional regulation, thereafter the work object is sucked again to put the work object into the immovable state, and thereafter, the work object is subjected to the specified work.

In the above-mentioned construction of the second and third aspects, suction is further performed again when subjecting to work the work object regulated in position on the work stage in addition to the first aspect. Therefore, the displacement ascribed to the work load of the work object is securely prevented by obtaining a sufficient suction state capable of enduring the work load without influence ascribed to the difference of the previous suction state from the suction state during work by virtue of the reduction and release of suction performed in positional regulation, by which the work is achieved with high accuracy, allowing a quality product to be provided.

According to a fourth aspect of the present invention, there is provided a working method as defined in any one of the first through third aspects, wherein the specified work is performed after starting the suction of the work object in the immovable state by turning on a suction device exclusively for work set in correspondence with the work.

In the above-mentioned construction of the fourth aspect, the specified work is performed after starting the suction by the suction device used exclusively for the work. Therefore, a suction state appropriate for performing the specified work can be immediately obtained without adjustment of the suction state or the like regardless of the previous suction state, by which high-accuracy work can be achieved with little time loss, allowing the quality of the work object to be improved without reducing the work efficiency.

According to a fifth aspect of the present invention, there is provided a working method as defined in any one of the first through fourth aspects, wherein the work object is an IC chip, the positional regulation is performed with use of the work stage whose IC chip placement surface that serves as the work object placement surface is a roughened surface, the recess portions provided around the protruding portions of the roughened surface that serve as the work object placement surface form pockets for letting the foreign object escape to restrain influence of the foreign object exerted on the IC chip when the bump bonding work is performed as the specified work with the IC chip subjected to heating to a bump bonding temperature of the bump bonding work, a pressure load, and a vibration load.

In the above-mentioned construction of the fifth aspect, numbers of support points of the protruding portions are existing in spots on the roughened surface between the work stage and the work object including the IC chip supported on the work stage, and the work object is stably moved on the work stage by obtaining appropriate frictional state, achieving high-accuracy positional regulation even if the release and reduction of the suction is performed. The recess portions provided around the protruding portions form pockets for letting the foreign object escape to restrain the strong abrasive movement of the foreign object between the work stage and the work object when the work object is moved for positional regulation and restrain the influence of the foreign object exerted on the work object when the work object is subjected to work with a pressure load and a vibration load as in the bump bonding work, which might additionally be accompanied by heating. Therefore, the work object can be prevented from suffering scratches, chipping and cracking by the foreign object when the work object is regulated in position or subjected to work with a variety of work loads.

The recess portions provided around the protruding portions are continued to one another to form pathways for dissipating the suction force in the reducing and releasing phase, and therefore, early reduction or early release of the suction is achieved, allowing the position regulating work to start early and allowing the operation efficiency to be improved.

According to a sixth aspect of the present invention, there is provided a working method as defined in any one of the first through fifth aspects, wherein the work object is an IC chip and the specified work is a bump bonding work for applying heat to the IC chip from the work stage side, pressing a metal wire against an electrode of the IC chip with ultrasonic vibrations applied to the metal wire and thus achieving metallic bond, and forming a metal bump on the IC chip by separating a succeeding metal wire from a bonded metal lump formed through the processes.

In the above-mentioned construction of the sixth aspect, when the above-mentioned work is the bump bonding work for applying heat from the work stage side to the IC chip, pressing the metal wire against the electrode of the IC chip with ultrasonic vibrations applied for the achievement of metallic bond and thereafter separating the succeeding metal wire from the bonded metal lump formed through the above processes, for the formation of the metal bump on the IC chip, even if the position regulating work is performed with a foreign object such as a processing dust interposed between the surface that belongs to the IC chip and is located opposite from the mounting surface onto the circuit board on which the bump bonding work of the IC chip is performed and the IC chip placement surface of the work stage, no strong abrasion occurs with respect to the foreign object by virtue of the reduction or release of the suction while securing the reception and acceptance of the IC chip placed on the work stage by suction. This prevents the surface from suffering scratches, chipping or cracking and allows the production of high-quality IC chips provided with bumps having no scratch on the surface with high yield.

According to a seventh aspect of the present invention, there is provided a working method as defined in the first aspect, wherein the specified work is bump bonding, the work object is an electronic component, and a suction force for sucking the electronic component onto the work stage through a suction hole of the work stage that has the suction hole for holding by suction the electronic component is switched between at least two types of a first suction force with which the electronic component is held by suction to such an extent that the electronic component can move along the stage on the stage and a second suction force, which is stronger than the first suction force and with which the electronic component is held by suction to such an extent that the electronic component cannot move along the stage on the stage, the working method comprising:

a process for switching the suction force to the second suction force;

a process for placing the electronic component on the stage and holding by suction the electronic component with the second suction force through the suction hole of the stage;

a process for switching the suction force for sucking the electronic component to the stage through the suction hole of the stage from the second suction force to the first suction force;

a position regulating process for moving the electronic component by a position regulating member for positioning while holding by suction the electronic component with the first suction force on the stage;

a process for immovably holding by suction the positioned electronic component on the stage by switching the suction force from the first suction force to the second suction force; and a process for performing bump bonding that serves as the specified work.

According to an eighth aspect of the present invention, there is provided a working method as defined in the first aspect, wherein the specified work is bump bonding, the work object is an electronic component, and a suction force for sucking the electronic component onto the stage through a position regulating suction hole of the work stage that has the position regulating suction hole for holding by suction the electronic component is switched between at least two types of a first suction force with which the electronic component is held by suction to such an extent that the electronic component can move along the stage on the stage and a second suction force, which is stronger than the first suction force and with which the electronic component is held by suction to such an extent that the electronic component cannot move along the stage on the stage, the working method comprising:

a process for switching the suction force to the second suction force;

a process for placing the electronic component on the stage and holding by suction the electronic component with the second suction force through the position regulating suction hole of the stage;

a process for switching the suction force for sucking the electronic component to the stage through the position regulating suction hole of the stage from the second suction force to the first suction force;

a position regulating process for moving the electronic component by a position regulating member for positioning while holding by suction the electronic component with the first suction force on the stage;

a process for immovably holding by suction the positioned electronic component on the stage by means of the position fixing suction hole of the stage; and a process for performing bump bonding that serves as the specified work.

According to a ninth aspect of the present invention, there is provided a working method as defined in the seventh or eighth aspect, wherein heat is applied to the electronic component via the stage, making the electronic component have a bump bonding temperature.

According to a tenth aspect of the present invention, there is provided a working apparatus comprising:

a work stage having suction holes for holding by suction a work object in a receiving position for receiving the work object to be placed on a work object placement surface that is a roughened surface and a work position in which the work object is moved from the receiving position to a specified position so as to be regulated in position and subjected to work;

a position regulating member for regulating in position the work object located in the receiving position of the work stage by pushing the object into the work position;

a suction mechanism for holding by suction the work object through the suction hole of the work stage in the receiving position and the work position of the work stage; and control means for controlling the suction mechanism so as to put the work object into an immovable state by holding by suction the work object while supporting the work object with protruding portions of the roughened surface of the work object placement surface of the work stage when the work object is placed and received in the receiving position on the work object placement surface of the roughened surface of the work stage, thereafter change an immovable state in which the object is held by suction into a movable state for positional regulation, thereafter regulate in position the work object into the work position while stably moving the work object on the work stage in a frictional state obtained by supporting the work object with the protruding portions of the roughened surface of the work object placement surface of the work stage and while restraining strong abrasive movement of a foreign object between the work stage and the work object in moving the work object for positional regulation by pockets that are formed of recess portions around the protruding portions and let the foreign object escape, put the work object regulated in position into the immovable state by sucking the object again, and thereafter subject the object to specified work.

According to the above-mentioned tenth construction, the working method of the first aspect can be automatically stably achieved at high speed.

According to an 11th aspect of the present invention, there is provided a working apparatus comprising:

a work stage having suction holes for holding by suction a work object in a receiving position for receiving the work object to be placed and a work position in which the work object is moved from the receiving position to a specified position so as to be regulated in position and subjected to work;

a position regulating member for regulating in position the work object located in the receiving position of the work stage by pushing the object into the work position;

a suction mechanism for holding by suction the work object through the suction hole of the work stage in the receiving position and the work position of the work stage; and control means for controlling the suction mechanism so as to put the work object into an immovable state by holding by suction the work object when the work object is placed and received in the receiving position on the work stage, thereafter change the immovable state in which the object is held by suction into a movable state for positional regulation, thereafter regulate in position the object into the work position, put the work object regulated in position into the immovable state by sucking the object again, and thereafter subject the object to specified work, wherein the suction mechanism is provided with a first suction system for holding by suction the work object in the receiving position and a second suction system for holding by suction the work object in the work position; and the control means controls the first and second suction systems of the suction mechanism so as to put the work object into the immovable state by holding by suction the object by the first suction system when the work object is placed and received in the receiving position on the work stage, thereafter change the immovable state in which the object is held by suction into the movable state for positional regulation by temporarily reducing or releasing the suction, thereafter regulate in position the object into the work position, put the work object regulated in position into the immovable state by sucking the object again by the second suction system, and thereafter subject the object to specified work.

In the 11th construction, in addition to the working method of the first aspect, the method of the second and third aspects can be automatically stably accomplished at high speed.

According to a 12th aspect of the present invention, there is provided a working apparatus as defined in the eleventh aspect, wherein the first suction system has first and second suction holes in a position corresponding to the work object located in the receiving position and in a position located apart from the work object held by suction in the receiving position, respectively, and the second suction system has suction holes in positions corresponding to the work object located in the work position.

According to the above-mentioned 12th aspect, the first suction system is provided with the first and second suction holes located in the position corresponding to the work object in the receiving position and the position located off the work object held by suction in this receiving position, while the second suction system is provided with the suction hole located in the position corresponding to the work object in the work position. With this arrangement, while securely receiving by suction the work object placed in the receiving position of the work stage by the suction further through the first suction hole of the first suction system in addition to the working apparatus of the second characteristics, the second suction hole is in the open state in which the hole is not facing the work object when reducing or releasing the suction for the next positional regulation and operates as a hole for releasing the suction force for reducing the suction. This enables the reduction or release of suction in an early stage, and accordingly, there is no influence of the suction even if a time lag in which the work object is shifted from the reception to the positional regulation is reduced. Therefore, the scratches, chipping and cracking due to the foreign object can be prevented to allow the positional regulation to be achieved, and the work efficiency can be improved without causing a reduction in quality. The second suction system can securely hold the work object concurrently with the positional regulation of the object without any issue by virtue of the suction through the suction hole that is facing the work object regulated in position and perform the work in an early stage after the positional regulation of the work object. Therefore, the work efficiency can be improved also in this aspect.

According to a 13th aspect of the present invention, there is provided a working apparatus as defined in the 12th aspect, wherein the second suction hole of the first suction system is provided in a position corresponding to the work object located in the work position.

According to the 13th aspect, if the second suction hole of the first suction system is provided in the position corresponding to the work object in the work position, then the work object gradually approaches the second suction hole as the work object is moved gradually apart from the first suction hole in the course of the positional regulation of the work object into the work position. Accordingly, there is the advantage that the required reduced suction force can be exerted during the period from the start phase to the end phase of positional regulation when the state of the reduced suction is achieved during the positional regulation period.

According to a 14th aspect of the present invention, there is provided a working apparatus comprising: a work stage having suction holes for holding by suction a work object, a receiving position for receiving the work object to be placed, and a work position in which the work object is moved from the receiving position to a specified position so as to be regulated in position and subjected to work; a position regulating member for regulating in position the work object located in the receiving position of the work stage by pushing the object into the work position; and a suction mechanism for holding by suction the work object through the suction hole of the work stage in the receiving position and the work position of the work stage, the work stage having an IC chip placement surface processed by electric discharge.

According to the 14th aspect, the IC chip placement surface of the work stage is formed by the electric discharge process into the roughened surface of an almost constant specified roughness by comparison with the case of the surface processing achieved by another method such as blasting. Therefore, the feature of the roughened surface obtained by the working method of the fourth aspect of the present invention can be stably put into effect regardless of the difference in position of the IC chip placement surface of the work stage and the difference of the working apparatus, allowing the work to be stabilized.

According to a 15th aspect of the present invention, there is provided a working apparatus as defined in any one of the 10th through 14th aspects, comprising a work mechanism for subjecting the work object to the specified work every time the work object is held by suction in the work position on the work stage, the work mechanism being a bump bonding mechanism for pressing a metal wire against an electrode of an IC chip that serves as the work object with ultrasonic vibrations applied to the wire for achievement of metallic bond and forming a metal bump on the electrode by separating the succeeding metal wire from a bonded metal lump formed through the above processes.

According to the above-mentioned 15th aspect, the working apparatus of which the work is the bump bonding for forming the metal bump on the electrode of the IC chip is provided with a work mechanism for performing a specified work on the IC chip every time the IC chip is held by suction in the work position on the work stage. This work mechanism is merely required to be a bump bonding mechanism for pressing the metal wire against the electrode of the IC chip that serves as the work object with ultrasonic vibrations applied for the achievement of metallic bond and thereafter separating the succeeding metal wire from the bonded metal lump through the above processes, for the formation of the metal bump on the electrode. If the heat source for heating the IC chip is in operation, then the work stage has the advantage that the metallic bond can be promoted to allow the bump bonding work to be securely achieved in a short time.

According to a 16th aspect of the present invention, there is provided a working apparatus as defined in the 15th aspect, wherein the work stage has a heat source operating to heat the IC chip.

According to a 17th aspect of the present invention, there is provided a working apparatus as defined in any one of the 10th through 16th aspects, wherein the work stage is mounted so as to be replaceable.

According to the 17th aspect, if the work stage is mounted so as to be replaceable, then the maintenance work required for a change due to the wearing of the roughened surface state and the work of replacing the work stage with the one that has a roughened surface corresponding to the type of the IC chip every time the IC chip is changed can be achieved on optimum conditions, which is preferable.

According to an 18th aspect of the present invention, there is provided an IC chip provided with a bump, which has no visible scratch on a surface opposite from a mounting surface on which a metal bump is bonded onto an electrode.

According to the 18th aspect, the IC chip provided with bumps has no visible scratch on the surface opposite from the mounting surface on which the metal bumps are bonded onto the electrode and is easily stably obtained by the aforementioned working method and working apparatus. This also eliminates the occurrence of visible scratches on the surface to be noticed not only in the electronic component state but also after the mounting of the component on a circuit board and assembled into equipment as well as the causes of scratches, chipping and cracking due to impact or the like during handling or the like, and therefore, high reliability can be ensured.

According to a 19th aspect of the present invention, there is provided a working apparatus as defined in the 10th aspect, wherein the work object is an electronic component, and the control means comprises a suction force control section that subjects the suction force for sucking the electronic component to the stage through the suction hole on the stage to switching control between at least two types of a first suction force with which the electronic component is held by suction in the state in which the electronic component can move along the stage on the stage and a second suction force, which is stronger than the first suction force and with which the electronic component is held by suction in the state in which the electronic component cannot move along the stage on the stage, sets the suction force for sucking the electronic component to the first suction force when the electronic component is moved for positioning while being held by suction on the stage and sets the suction force to the second suction force when the electronic component is received on the stage before being positioned and when the positioned electronic component is held by suction on the stage in the immovable state.

According to a 20th aspect of the present invention, there is provided a working apparatus as defined in the tenth aspect, wherein the work object is an electronic component, and the control means comprises a suction force control section that subjects the suction force for sucking the electronic component to the stage through the suction hole on the stage to switching control between at least two types of a first suction force with which the electronic component is held by suction in the state in which the electronic component can move along the stage on the stage and a second suction force, which is stronger than the first suction force and with which the electronic component is held by suction in the state in which the electronic component cannot move along the stage on the stage, sets the suction force for sucking the electronic component to the first suction force when the electronic component is moved for positioning while being held by suction on the stage and sets the suction force to the second suction force in order to hold by suction the positioned electronic component on the stage in the immovable state when the electronic component is received on the stage before being positioned, and the electronic component regulated in position is fixed in position by suction by the position fixing suction hole of the stage.

According to a 21st aspect of the present invention, there is provided a working apparatus as defined in the 19th or 20th aspect, wherein a heater is arranged inside the stage, and heat for bump bonding is applied to the electronic component.

According to a 22nd aspect of the present invention, there is provided an IC chip having undergone the bump bonding by the working method defined in the sixth aspect.

According to a 23rd aspect of the present invention, there is provided an electronic component having undergone the bump bonding by the working method defined in any one of the seventh through ninth aspects.

According to a 24th aspect of the present invention, there is provided a working apparatus comprising:

an immovably fixed work stage having suction holes for holding by suction a work object in a receiving position for receiving the work object to be placed and a work position in which the work object is moved from the receiving position to a specified position so as to be regulated in position and subjected to work;

a position regulating member for regulating in position the work object located in the receiving position of the work stage, which can be moved in two directions that are perpendicular to each other and located in a work object placement surface of the work stage by pushing the object into the work position on the work stage;

a suction mechanism for holding by suction the work object through the suction hole of the work stage in the receiving position and the work position of the work stage; and control means for controlling the suction mechanism so as to put the work object into an immovable state by holding by suction the work object when the work object is placed and received in the receiving position on the work stage, thereafter change the immovable state in which the object is held by suction into a movable state for positional regulation, thereafter regulate in position the object into the work position, put the work object regulated in position into the immovable state by sucking the object again, and thereafter subject the object to specified work.

According to a 25th aspect of the present invention, there is provided a working method for holding by suction a work object placed on a work stage, moving the work object into a specified position, regulating in position the object, and thereafter subjecting the object to specified work, comprising:

receiving an IC chip that serves as the work object to be placed on an IC chip placement surface of a roughened surface of the work stage; holding by suction the IC chip while supporting the IC chip by protruding portions of the roughened surface of the IC chip placement surface of the work stage;

thereafter changing an immovable state in which the object is held by suction into a movable state for positional regulation; and thereafter providing pockets that are formed of recess portions provided around the protruding portions of the roughened surface serving as the IC chip placement surface and let the foreign object escape to restrain influence of the foreign object exerted on the IC chip when the bump bonding work is performed with the IC chip subjected to heating to a bump bonding temperature of the bump bonding work, a pressure load, and a vibration load.

According to a 26th aspect of the present invention, there is provided a working apparatus comprising:

a work stage having suction holes for holding by suction a work object in a receiving position for receiving the work object to be placed on the work object placement surface that is a roughened surface and a work position in which the work object is moved from the receiving position to a specified position so as to be regulated in position and subjected to work;

a position regulating member for regulating in position the work object located in the receiving position of the work stage by pushing the object into the work position;

a suction mechanism for holding by suction the work object through the suction hole of the work stage in the receiving position and the work position of the work stage;

control means for controlling the suction mechanism so as to put the work object into an immovable state by holding by suction the work object when the work object is placed and received in the receiving position on the work object placement surface of the roughened surface of the work stage, thereafter change the immovable state in which the object is held by suction into a movable state for positional regulation, thereafter regulate in position the object into the work position, put the work object regulated in position into the immovable state by sucking the object again, and thereafter subject the object to specified work; and a work mechanism for subjecting the work object to the specified work every time the work object is held by suction in the work position on the work stage, the work mechanism being a bump bonding mechanism for pressing a metal wire against an electrode of an IC chip that serves as the work object with ultrasonic vibrations applied to the wire for achievement of metallic bond and forming a metal bump on the electrode by separating the succeeding metal wire from a bonded metal lump formed through the above processes, and pockets formed of recess portions provided around the protruding portions of the roughened surface serving as the IC chip placement surface escaping the foreign object to restrain influence of the foreign object exerted on the IC chip when the bump bonding work is performed with the IC chip subjected to heating to a bump bonding temperature of the bump bonding work, a pressure load, and a vibration load by the bump bonding mechanism.

The features of the aspects of the present invention can be each used singly as far as possible and also in a variety of combinational complex forms.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
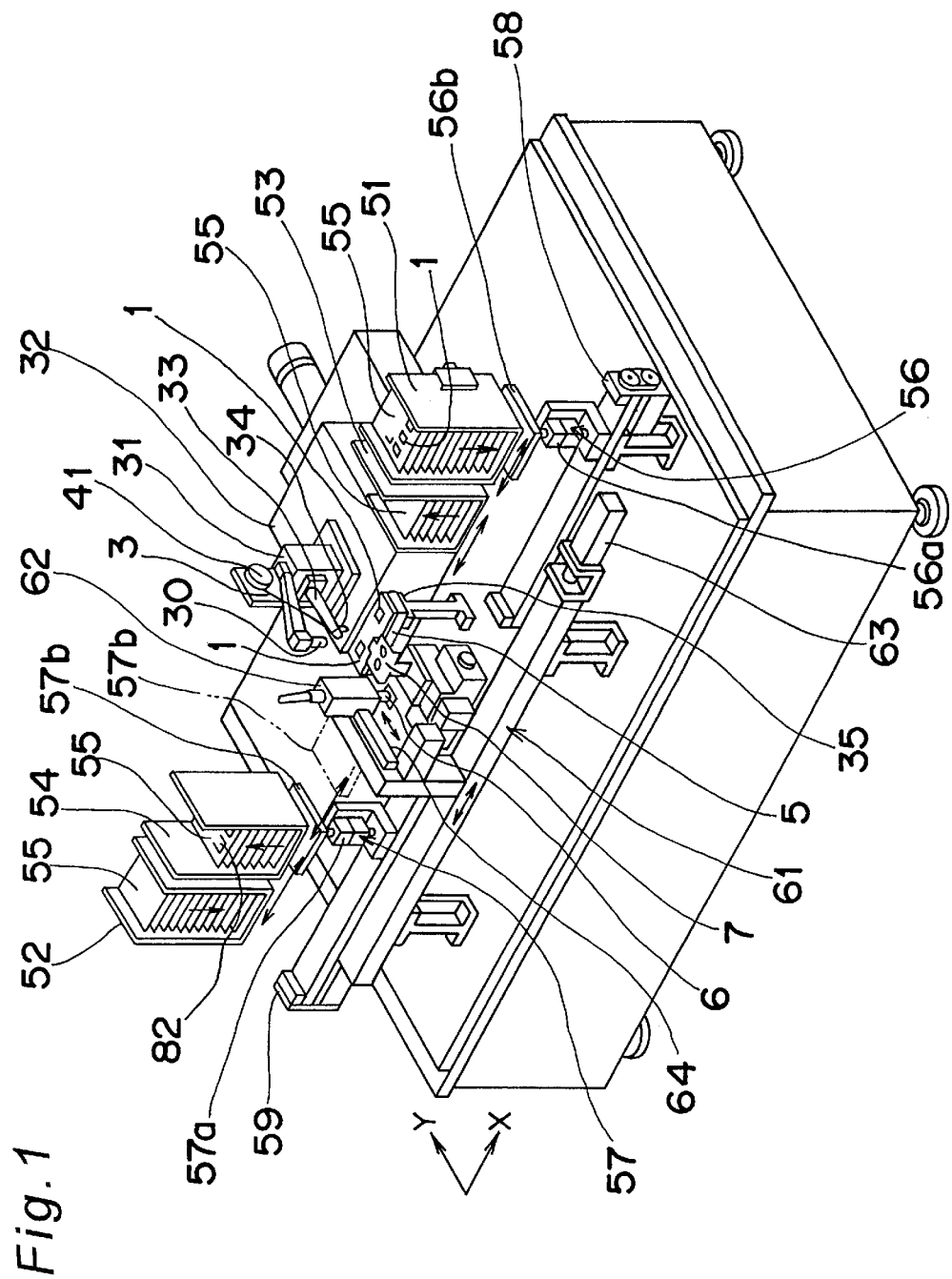
FIG. 1 is an overall structural view of a bump bonding apparatus that serves as an example of a working apparatus according to a first embodiment of the present invention, for performing bump bonding work.

Before the description of the present invention proceeds, it is to be noted that like parts are designated by like reference numerals throughout the accompanying drawings.

(First Embodiment)

The first embodiment of the present invention will be described in detail below with reference to the drawings.

A bump bonding method and apparatus that serves as an example of the working method and apparatus of the first embodiment of the present invention as well as an IC chip provided with bumps obtained by them will be described in detail below with reference to FIGS. 1 through 7, for the understanding of the present invention.

Figure 3:
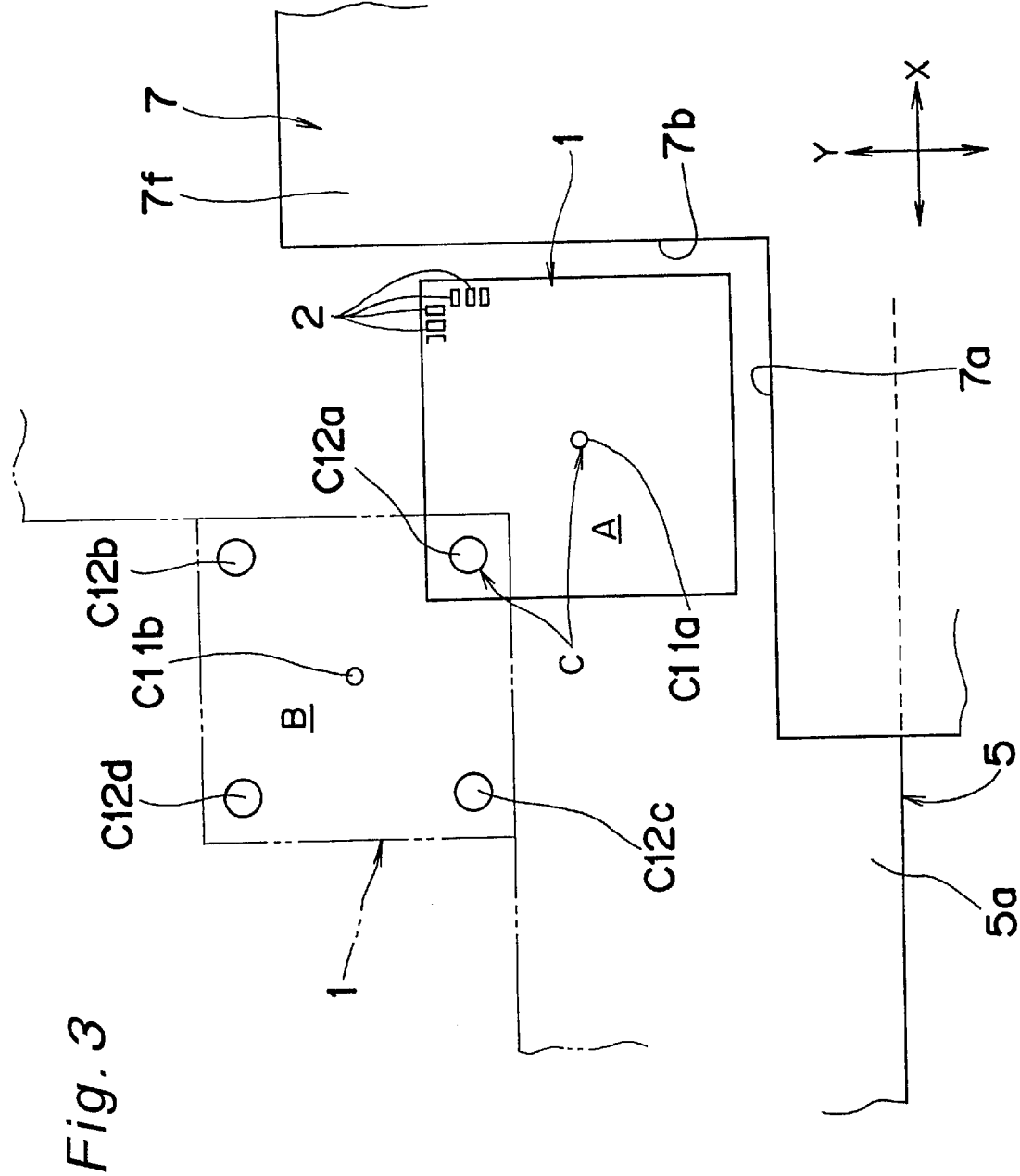
FIG. 3 is a plan view showing a placement position and a work position on the work stage of FIG. 2 and a state in which an IC chip is regulated in position.
Figure 4:
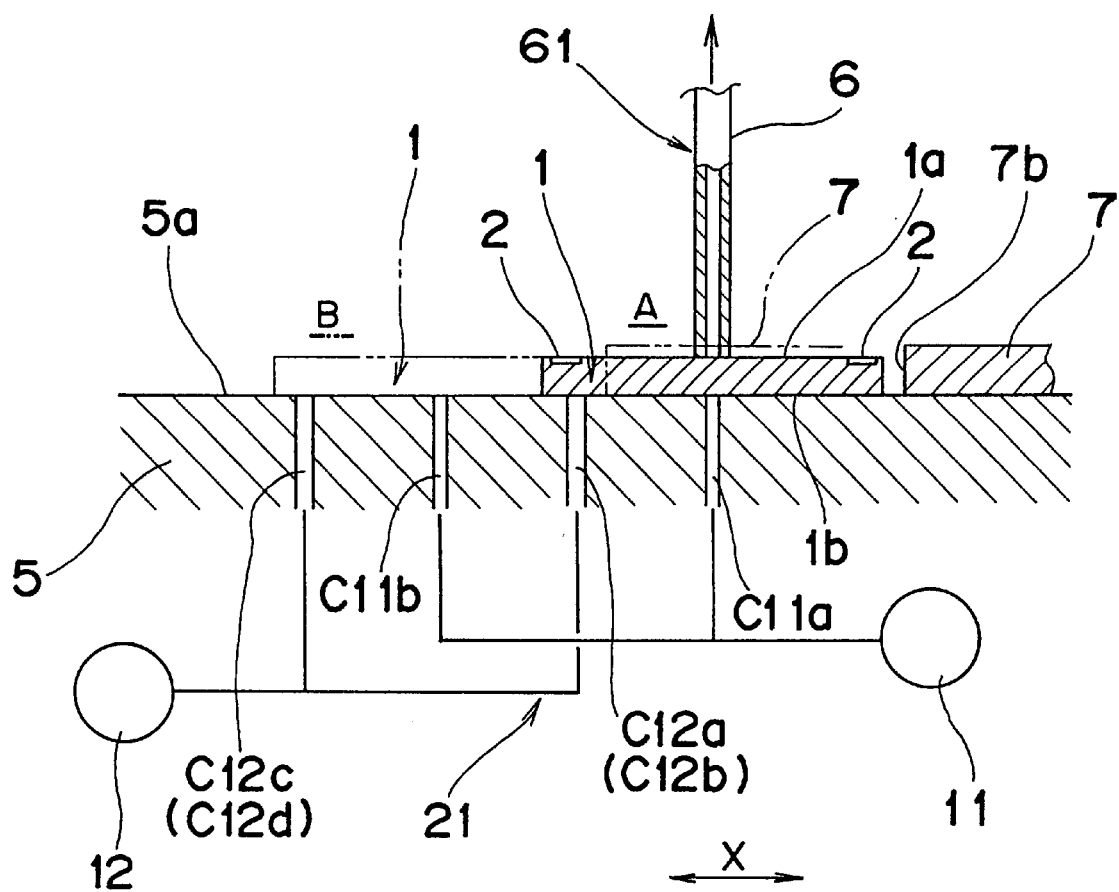
FIG. 4 is a sectional view of FIG. 3.
Figure 5D:
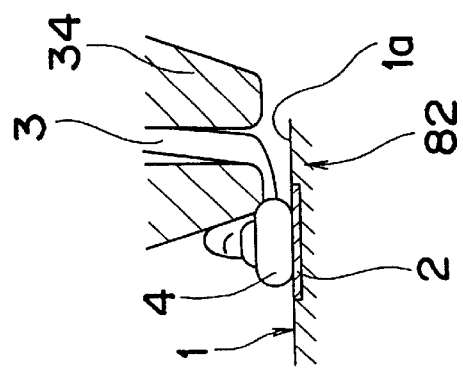
FIG. 5D is a sectional view showing a procedure of the bump bonding work of a process for cutting the metal wire by pressing the extended metal wire against the bonded metal lump and separating the succeeding metal wire.

The first through third embodiments are applied to an IC chip 1 that serves as a more concrete example of the semiconductor component as an example of the work object, and each of the embodiments is an example of work for forming a metal bump 4 as shown in FIG. 5D on an electrode 2 formed on one surface of the IC chip 1, which principally has an integrated circuit as shown in FIGS. 3 and 4. However, the present invention is not limited to the first through third embodiments, and it is effective to apply the present invention to a variety of works that have the processes of holding by suction the work object placed on a variety of work stages, moving this work object into a specified position, regulating the object in position and thereafter subjecting the object to specified work as described above and have the aforementioned issues.

Figure 2:
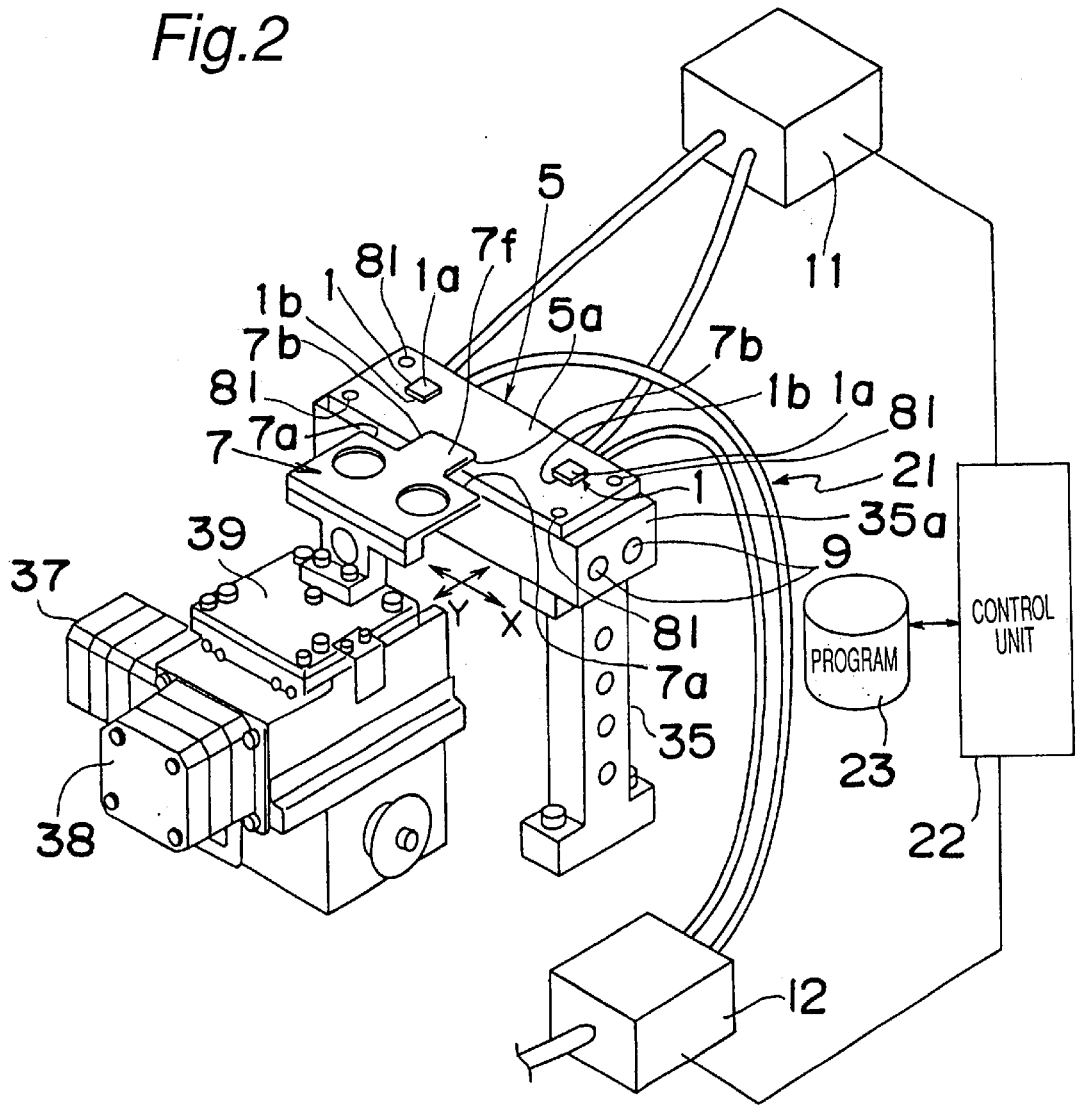
FIG. 2 is a perspective view of part of a work stage and its peripheral of the bump bonding apparatus of FIG. 1.
Figure 5C:
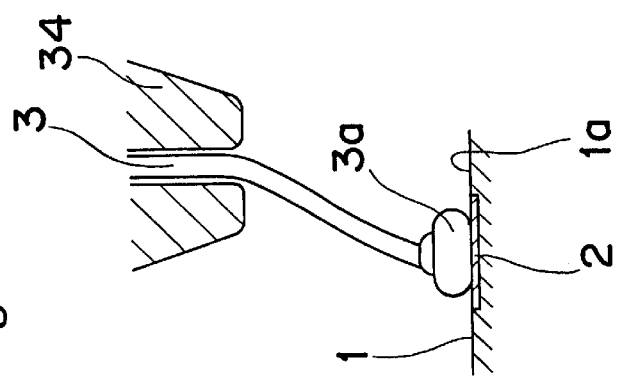
FIG. 5C is a sectional view showing a procedure of the bump bonding work of a process for extending succeeding metal wire from a bonded metal lump formed in FIG. 5B.
Figure 5B:
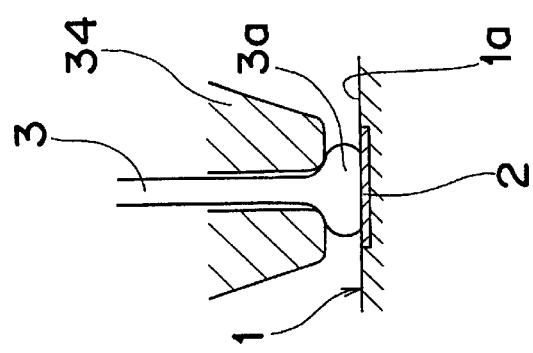
FIG. 5B is a sectional view showing a procedure of the bump bonding work of a metallic bond process performed by pressing the metal wire against an electrode and applying heat with ultrasonic vibrations.

With reference to FIGS. 1 and 2 showing the overall construction and the essential part of an apparatus, the working method of the first embodiment of the present invention is to hold by suction the IC chip 1 placed on the IC chip placement surface, or, for example, an upper surface 5a of a work stage 5, move this IC chip 1 to a specified position, regulate the chip in position and thereafter subject the chip to specified bump bonding work. For this purpose, the apparatus receives by suction the IC chip 1 placed as indicated by the solid lines shown in FIG. 3 on the upper surface 5*a* of the work stage 5, brings the IC chip 1 into an unmovable state and thereafter performs the aforementioned positional regulation for moving the IC chip 1, of which the suction is reduced or released, into the specified position indicated by the imaginary lines shown in FIG. 3 in a movable state for positional regulation. After the above-mentioned positional regulation, the apparatus holds by suction the IC chip 1 again on the upper surface 5*a* of the work stage 5 so as to bring the IC chip 1 into the unmovable state and thereafter performs the bump bonding work. The bump bonding work is to apply heat by a heater 9 as shown in FIG. 2 from the work stage 5 side to the IC chip 1, press a metal wire 3 against the electrode 2 of the IC chip 1 with ultrasonic vibrations applied for the achievement of metallic bond as shown in FIG. 5B and thereafter separate the succeeding metal wire 3 from a bonded metal lump 3*a* formed through the above processes as shown in FIGS. 5C and 5D, forming a metal bump 4 on the electrode 2 of the IC chip 1. In this case, the metallic bond is merely required to guarantee electrical connection to the end of the operating life of the product or for a longer time and should preferably be achieved with the melting of metal. However without being limited to this, the metallic bond may be bonding that is not accompanied by melting.

Through the bump bonding work as described above, if a delay occurs in releasing the vacuum when placing the IC chip 1 located on the suction nozzle 6 side in the case where a component handling mechanism 61 as shown in FIG. 1 handles, for example, a suction nozzle 6 as a component handling tool, holds by suction the IC chip 1 and conveys the chip to place it on the work stage 5 by holding by suction the IC chip 1 placed on the upper surface 5*a* of the work stage 5, the IC chip 1 placed from the component handling mechanism 61 side by the holding by suction of the IC chip 1 located on the work stage 5 side can be securely received and accepted by being forcibly separated, and the positional regulation of the IC chip 1 from the receiving position to the specified position on the upper surface 5*a* of the work stage 5 is performed by moving the chip in a state in which the suction to the work stage 5 is reduced or released. Through the above operation, they are not brought in strong abrasive contact with each other even when a foreign object is interposed between the chip and the work stage 5. Therefore, the mounting surface 1*a* that is the rear surface of the IC chip 1, put in contact with the work stage 5 and is mounted on a circuit board can be prevented from suffering chipping and cracking, and this allows the quality and yield of the product to be improved. Indeed, the movement of the IC chip 1 for positional regulation is generally achieved by pushing a position regulating member 7, and there is no issue of positional regulation accuracy when a pushing speed in the state in which the suction is released is set to, for example, about 50 mm/sec.

After the IC chip 1 is regulated in position on the work stage 5, the IC chip 1 is held by suction again so as to be brought into an immovable state in performing the bump bonding work. As described above, the IC chip 1 is held by suction again as to be brought into the immovable state in performing the bump bonding work after being regulated in position on the stage 5. Therefore, even if the suction state before the bump bonding work due to the reduction or release of the suction in performing positional regulation, i.e., a movable state differs from the suction state required for the bump bonding work, i.e., the immovable state, then sufficient suction state capable of enduring the work loads of pressing, ultrasonic vibrations and so on can be obtained by changing the suction state from the movable state into the immovable state. The displacement of the IC chip 1 due to the work loads of the IC chip 1 can reliably be prevented to allow the bump bonding work to be achieved with high accuracy, and this enables the provision of a quality product such as an IC chip provided with bumps as shown in FIG. 5D.

The bump bonding work applies a heavy work load due to the pressure application and ultrasonic vibrations to the IC chip 1. Therefore, in order to achieve the aforementioned specified work with high accuracy with the IC chip 1 put into the immovable state in which the movement of the IC chip 1 is prevented, there is needed a suction force of about 60 kPa, which is several times greater than a suction force of about 20 kPa required in receiving the IC chip 1. These suction forces may be satisfied by properly using the suction force of one suction device of, for example, a vacuum pump by adjusting the suction force. However, if there is the issue that much time is required for the adjustment of the suction force with one vacuum pump or the adjustment is loose, then it is proper to selectively use first and second vacuum pumps 11 and 12 that serve as an example of the first and second suction means constructed of two vacuum pumps whose suction forces are differently set as in the first embodiment shown in FIG. 2.

Theoretically, the aforementioned work is performed after starting the specified work of, for example, suction by the second vacuum pump 12 provided exclusively for specified work of, for example, the bump bonding work. Therefore, a suction state appropriate for performing the specified work can be immediately obtained without suction condition adjustment nor the like regardless of the preceding suction state, and the high-accuracy work can be achieved without time loss, improving the quality of the work object such as the IC chip 1.

The bonding work is performed by means of the work stage 5 whose upper surface 5*a* is a roughened surface. It is proper to make the work stage 5 of stainless steel in terms of hardness and durability. The roughened surface may be formed by any method such as blasting, electric discharge machining and wrapping sand papering and is properly set to a surface roughness of, for example, about 10 to 13 $\mu$m by comparison with the conventional surface roughness of about 1 $\mu$m of mirror finish. However, without being limited to this, it is sufficient to set the surface roughness to, for example, about 10±5 $\mu$m and it is practically effective to set the surface roughness within a range of, for example, 3 to 30 $\mu$m.

By virtue of numbers of support points of protruding portions existing in spots on the roughened surface between the work stage 5 and the IC chip 1 supported on the upper surface 5*a,* or the roughened surface of the work stage 5, recess portions located around the protruding portions form pockets for letting foreign objects such as dust of processing, chip dust and air dust escape in a manner that the IC chip 1 is regulated in position with high accuracy by being stably moved even when the suction is released or reduced with the IC chip 1 having an appropriate frictional resistance. This arrangement restrains the strong abrasive movement of the foreign object between the work stage 5 and the IC chip 1 when the IC chip 1 is moved when regulated in position and restrains the influence of the foreign object exerted on the IC chip 1 when the IC chip 1 is subjected to work while being heated to a bump bonding temperature with a pressure load and a vibration load as in the bump bonding work. Therefore, the IC chip 1 can be prevented from suffering scratches, chipping and cracking due to the foreign object when the IC chip 1 is regulated in position or subjected to work with work loads.

The recess portions located around the protruding portions are continued to one another to form pathways for dissipating the suction force in reducing and releasing the suction, and therefore, the reduction or release of the suction in an early stage is achieved to allow the position regulating work to start early, giving contributions to an improvement in operation efficiency. Although the roughened surface of the upper surface 5a of the work stage 5 is worn out as time elapses, maintenance can easily be achieved by performing wrapping sand papering or the like. The roughening and maintenance of the upper surface 5a is basically permitted to be performed within an a real range in which the IC chip 1 is handled.

As illustrated by the overall view in FIG. 1 and the view of the essential part in FIG. 2, in order to achieve the aforementioned working method, the working apparatus of the first embodiment of the present invention has a basic construction including a work stage 5 that has suction holes C12a, C12b, C12c and C12d as shown in FIGS. 3 and 4 for holding by suction the IC chip 1 in a receiving position A in which the IC chip 1 to be placed is received and in a work position B in which the IC chip 1 is moved from the receiving position A into a specified position and regulated in position so as to be subjected to the bump bonding work, a position regulating member 7 for pushing the IC chip 1 located in the receiving position A of this work stage 5 into the work position B and regulating the chip in position and a suction mechanism 21 as shown in FIGS. 2 and 4 for holding by suction the IC chip 1 through the suction holes C12a, C12b, C12c and C12d of the work stage 5 in the receiving position A and the work position B of the work stage 5. The above-mentioned construction is provided with, in particular, a control means 22 as shown in FIG. 2, for controlling the suction mechanism 21 so as to put the IC chip 1 into the immovable state by holding by suction the chip when the chip is placed and received in the receiving position A on the work stage 5, thereafter reduce or release the suction to provide the movable state, thereafter subject the chip to positional regulation in the work position B, suck again the IC chip 1 regulated in position to provide the immovable state and thereafter subject the chip to the specified work. The control means 22, which is provided by commonly using a control unit such as a microcomputer for performing operation control of the entire working apparatus, may be one for exclusive use or one to be commonly used as other control means. The means operates according to or in relation to a program 23 for controlling the operation of the entire working apparatus and is able to automatically stably achieve the aforementioned bump bonding working method at high speed.

The suction mechanism 21 is provided with a first suction system of, for example, a first vacuum pump 11 for holding by suction the IC chip 1 located in the receiving position A in the immovable state and a second suction system of, for example, a second vacuum pump 12 for holding by suction the IC chip 1 located in the work position B in the immovable state.

Figure 6:
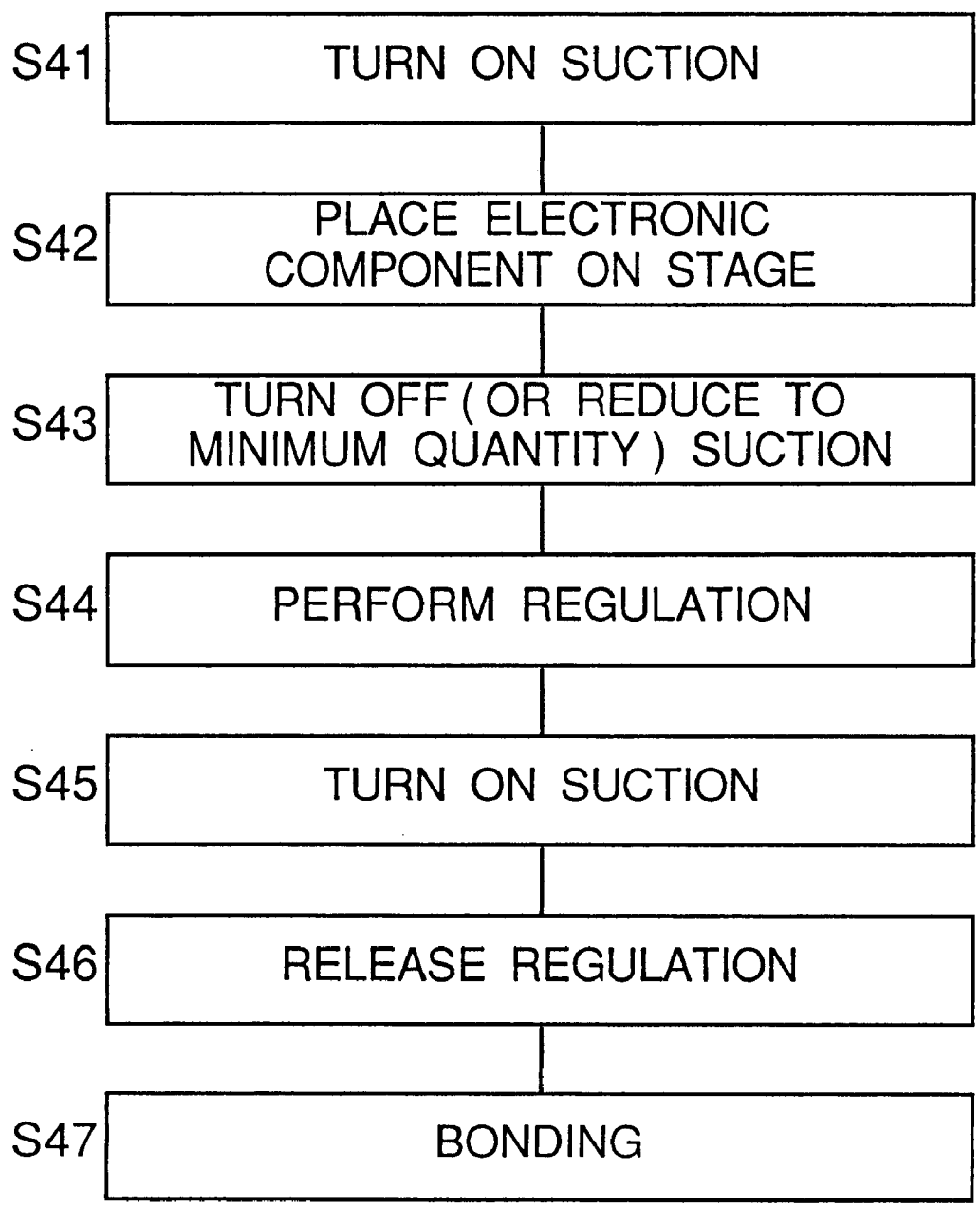
FIG. 6 is a flowchart showing the working method of the first embodiment performed by the apparatus of FIGS. 1 and 2.

FIG. 6 shows an example of the operation control in this case. Describing this operation, first of all, the first vacuum pump 11 of the suction mechanism 21 is driven by the control means 22 to effect the suction of the IC chip 1 by the first vacuum pump 11 (step S41), and the IC chip 1 is placed on the work stage 5 and received by suction to hold the chip in the immovable state (step S42). Next, the suction is stopped or reduced to a very small quality to perform the positional regulation of the IC chip 1 from the receiving position A to the work position B by the position regulating member 7 for establishing a position regulating movable state (steps S43 and S44). After putting the IC chip 1 in the work position B into a suction state in which the chip can endure the work load i.e., the immovable state by turning on the suction for the bump bonding work by means of the second vacuum pump 12 of the suction mechanism 21 with the second vacuum pump 12 turned on by the control means 22 after this positional regulation (step S45), the regulation is released (step S46) and the bump bonding work is performed (step S47).

However, particularly in the first embodiment shown in FIG. 2, in relation to the arrangement that the suction mechanism 21 is provided with the first vacuum pump 11 for holding by suction the IC chip 1 in the receiving position A and the second vacuum pump 12 for holding by suction the IC chip 1 in the work position B, the control means 22 controls the first and second vacuum pumps 11 and 12 so as to hold by suction the IC chip 1 placed in the receiving position A on the work stage 5 by the first vacuum pump 11 when receiving the chip to put the IC chip 1 into the immovable state, subsequently reducing or releasing the suction to put the IC chip 1 into the movable state, thereafter move the IC chip 1 to subject the chip to the positional regulation, hold by suction the IC chip 1 regulated in position by the second vacuum pump 12 instead of the first vacuum pump 11 to put the IC chip 1 into the immovable state and thereafter subject the chip to the bump bonding work.

Further, as shown in FIGS. 3 and 4, a first suction hole C11a having a diameter of 0.6 mm serving as an example in a position of the receiving position A corresponding to the IC chip 1 is provided as a suction hole that communicates with the first vacuum pump 11, while a second suction hole C11b having a diameter of 0.6 mm serving as an example is provided in a position located off the IC chip 1 held by suction in the receiving position A. On the other hand, as suction holes that communicate with the second vacuum pump 12, there is provided a plurality of suction holes having a diameter of 1.0 mm serving as an example in positions of the work position B corresponding to the IC chip 1, or concretely four suction holes C12a through C12d.

With this arrangement, when reducing or alleviating the suction for the next positional regulation while reliably receiving by suction the IC chip 1 placed in the receiving position A of the work stage 5 by the suction through the first suction hole C11a of the first vacuum pump 11, the second suction hole C11b put in an open state instead of being opposite to the IC chip 1 operates as a releasing hole for releasing the suction force for the reduction and alleviation of the suction, allowing the suction to be reduced or released in an early stage. Therefore, the positional regulation can be achieved without receiving the influence of strong suction even when a time lag of the shift from the receiving process of the IC chip 1 to the positional regulation process is shortened, and this allows the operation efficiency to be improved without causing a reduction in quality.

The second vacuum pump 12 is able to reliably hold by suction the IC chip 1 concurrently with the positional regulation of the IC chip 1 by the suction through the suction holes C12a through C12d that are facing the IC chip 1 regulated in position and perform the bump bonding work in an early stage after the positional regulation of the IC chip 1, and therefore, the operation efficiency is improved in this aspect. As in the illustrated first embodiment, the second vacuum pump 12 should preferably be provided with a plurality of suction holes C12a through C12d arranged in a dispersed state rather than being single so as to hold by suction several portions of the IC chip 1, for the sake of restraining the movement of the IC chip 1.

Furthermore, if the second suction hole C11b of the first vacuum pump 11 is provided in the position of the work position B corresponding to the IC chip 1 in the first embodiment shown in FIG. 3, then the IC chip 1 gradually approaches the second suction hole C11b as the IC chip 1 is moved away from the first suction hole C11a in the course of the positional regulation of the IC chip 1 into the work position A. Accordingly, there is the advantage that the required suction force can be effected from the start phase to the end phase of the positional regulation when establishing a reduced suction state during the positional regulation.

The position regulating member 7 is a plate member having position regulating sides 7a and 7b extending in the two directions of XY-directions that are perpendicular to each other and regulates in position the IC chip 1 received on the work stage 5 by pushing the chip in the two directions into the work position B set in the specified position. For this operation, the position regulating member 7 is provided on an XY-table 39 driven in the two directions of XY-directions by an X-axis motor 37 and a Y-axis motor 38, as shown in FIG. 2.

It is to be noted that the work stage 5 handles IC chips 1 parallel in the left and right two portions as shown in FIGS. 1 and 2 so as to improve the operation efficiency of the bump bonding work. In correspondence with this, the position regulating member 7 regulates in position alternately the IC chips 1 handled on the left and right sides and is provided with a T-figured planar shape of a pair of left and right position regulating sides 7a and 7b located on both sides of a roughly T-figured position regulating head portion 7f oppositely to the IC chips 1 handled on the left and right sides.

Figure 5A:
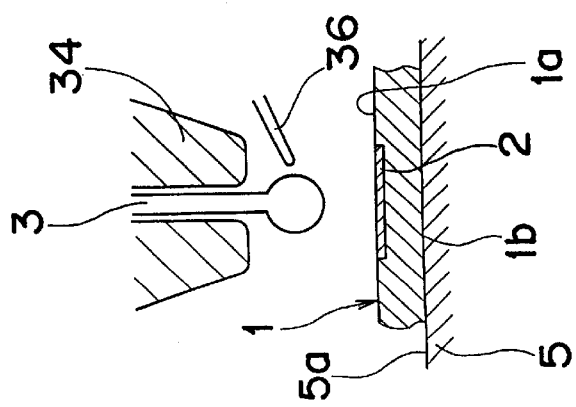
FIG. 5A is a sectional view showing a procedure of the bump bonding work performed by electric discharge machining for forming a metal wire tip into a spherical shape.

In relation to the first embodiment shown in FIG. 1 in which the aforementioned work is the bump bonding work for forming the metal bump 4 on the electrode 2 of the IC chip 1, the working apparatus of the first embodiment is provided with a monitor camera 30 for recognizing the work position B and monitoring the work state and work position in association with a bump bonding mechanism 31 for performing the specified bump bonding work on the IC chip 1 every time the IC chip 1 is held by suction in the work position B on the work stage 5. This bump bonding mechanism 31 is installed on a movement base 32 that moves in the two directions of XY-directions that are perpendicular to each other and located adjacent to the work stage 5 and is provided with a capillary 34, which is provided at the tip of a horn 33 extending toward the work stage 5 and through which a metal wire 3 such as a gold wire serving as a bump material is put. In order to perform bump bonding on the electrode 2 of the IC chip 1 regulated in position in the work position B of the work stage 5, the metal wire 3 fed from a wire supply section 41 as shown in FIG. 1 is put through the capillary 34 from above as shown in FIG. 5A, and the tip of this metal wire 3 put through the capillary is subjected to electric discharge from a counter electrode 36, by which the tip of the metal wire 3 is softened and melted by a spark generated between both the electrodes. Next, as shown in FIG. 5B, the capillary 34 is moved down to press the spherical tip of the metal wire 3 against the electrode 2 of the IC chip 1 regulated in position, applying a pressure. The pressure application is performed so as to apply a load of, for example, about 30 g as described above. Concurrently with this pressure application, ultrasonic vibrations are applied to the metal wire 3 pressed against the electrode 2 via the capillary 34 from the horn 33, metallically bonding the metal wire 3 to the electrode 2. This bonding includes welding accompanied by melting as described above as well as bonding accompanied by no melting. After the bonding, the capillary 34 is moved up to feed the succeeding metal wire 3 by a specified amount as shown in FIG. 5C with respect to the bonded metal lump 3a formed by the metallic bond on the electrode 2, and thereafter, the capillary 34 is moved down again while controlling the loop shape of the succeeding metal wire 3 and the bonded metal lump 3a. A portion that belongs to the metal wire 3 and is located adjacent to the tip of the capillary 34 is pressed against the bonded metal lump 3a by the capillary 34 as shown in FIG. 5D, and the metal wire 3 is cut in the pressed portion so as to be separated from the bonded metal lump 3a, forming the metal bump 4.

For the aforementioned metallic bond, the work stage 5 is provided with an appropriate heater 9 such as a sheath heater located on a work stand 35 side supporting the stage, and the bonding of the metal wire 3 to the electrode 2 is promoted by heating the IC chip 1 to a bump bonding temperature of, for example, 250(C. or a higher temperature.

In correspondence with the IC chips 1 handled parallel on the left-hand and right-hand sides of the work stage 5 as described above, across the stage 5, a pair of a component supply section 51 and an empty tray storage section 53 is provided on one side, while a pair of an empty tray supply section 52 and a product storage section 54 is provided as a product storage section for storing a product 82 of the IC chip 1, which is obtained through the work, i.e., provided with metal bumps 4. The component supply section 51, the empty tray storage section 53, the empty tray supply section 54 and the product storage section 54 are to be handled while being stored in a multiplicity of tires so that trays 55 storing a plurality of IC chips 1 and products 82 serving as components in alignment can be taken in and out. The component supply section 51 and the empty tray supply section 52 serve to supply the semiconductor components 1 before work and store the products 82 after work by taking out one by one the trays 55 stored therein, while the empty tray storage section 53 and the product storage section 54 serve to store empty trays 55 after component supply and the products 82 that have undergone work and store the trays 55 in a multiplicity of tires by receiving them from below.

In order to handle the IC chips 1 and products 82 that are the components, a tray handling mechanism 56 is provided between the adjoining component supply section 51, the empty tray storage section 53 and the work stage 5, while a tray handling mechanism 57 is provided between the adjoining empty tray supply section 52, the product storage section 54 and the work stage 5.

Describing the one set of the component supply section 51, the empty tray storage section 53 and the tray handling mechanism 56, the tray handling mechanism 56, which is reciprocated in the X-direction by an X-axis drive mechanism 58, moves up by the extension of a cylinder 56a in a stop state below the component supply section 51 to receive the tray 55 in which the IC chip 1 before work is stored from the component supply section 51 onto a support base 56b and thereafter moves down. Next, the tray moves back to the empty tray storage section 53 side, moves underneath the empty tray storage section 53 to reach the component supply position near the work stage 5 and stops to be subjected to component supply of the IC chips 1 before work. As described above, when all the IC chips 1 are consumed, the supply of IC chips 1 is completed. By this operation, the tray handling mechanism 56 moves back and stops when reaching the position below the empty tray storage section 53 to store the tray 55 that has been emptied into the empty tray storage section 53 from below by moving up by the extension of the cylinder 56a.

Describing the other set of the empty tray supply section 52, the product storage section 54 and the tray handling mechanism 57, the tray handling mechanism 57, which is reciprocated in the X-direction by an X-axis drive mechanism 59, moves up by the extension of a cylinder 57a in a stop state below the empty tray supply section 52 to receive the empty tray 55 from the empty tray supply section 52 onto a support base 57b and thereafter moves down. Next, the tray moves back to the product storage section 54 side, moves underneath the product storage section 54 to reach the component storage position near the work stage 5 and stops to be subjected to product storage of the IC chips 1 that have undergone work. By this operation, the IC chips 1 located in one block are stored as the products 82. When all the IC chips 1 are thus stored as the products 82 that have undergone work, the storage of the products 82 is completed. Through this operation, the tray handling mechanism 57 moves back and stops when reaching the position below the product storage section 54 to store the tray 55 that has stored the products into the product storage section 54 from below by moving up by the extension of the cylinder 56a.

As described above, the trays 55 are regulated in position on both sides of the work stage 5 by the left and right tray handling mechanisms 56 and 57 and subjected to the supply of IC chips 1 that serve as the components and the storage of the products 82. The work of the IC chips 1 regulated in position on the left-hand and right-hand sides of the work stage 5 is alternately performed by one bump bonding mechanism 31. Therefore, by providing only one component handling mechanism 61, which places the IC chip 1 before work inside the tray 55 into the receiving position A on the work stage 5 to subject the chip to work and stores the IC chip 1 that has undergone work and is placed in the work position B of the work stage 5 with regard to the trays 55 that are regulated in position on both sides of the stage 5 and subjected to component supply and product storage, the IC chip 1 and the product 82 that are the components located on the left-hand and right-hand sides are alternately handled.

FIG. 1 of the first embodiment shows an example in which the component handling mechanism 61 is provided by the suction nozzle 6 adopted as the handling tool as described hereinabove. A component handling head 62, which vertically movably supports the suction nozzle 6, is moved in the two directions of XY-directions by an X-axis drive mechanism 63 and a Y-axis drive mechanism 64 so that the nozzle moves to the component storage positions of the trays 55 regulated in position in the receiving position A and the work position B located on the left-hand and right-hand sides of the work stage 5 and on both sides of the work stage 5 to allow the IC chip 1 to be picked up by being held by suction and allow the IC chip 1 held by suction to be conveyed and placed by releasing the suction. When reaching a specified position, the suction nozzle 6 moves down to the IC chip 1 to perform the holding by suction or the release of suction of the chip and thereafter moves up to pick up or place the IC chip 1. However, these constructions are not essential and are able to be modified in a variety of forms. The conveyance efficiency of the IC chip 1 can be increased by providing two suction nozzles 6.

Figure 7:
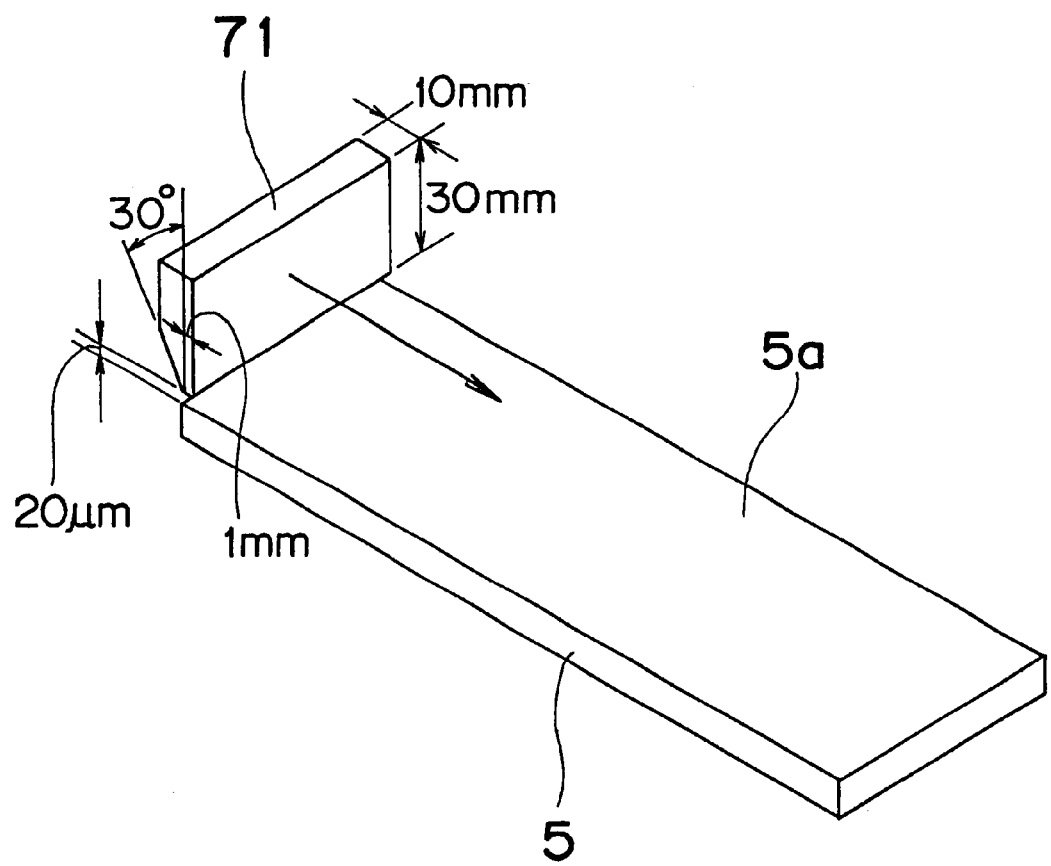
FIG. 7 is an explanatory view when the work stage of FIGS. 1 and 2 is processed by the electric discharge machining.

As shown in FIG. 7, the upper surface 5a of the work stage 5 is a roughened surface that is processed by electric discharge machining by being relatively moved while facing an electrode 71. By the electric discharge machining, there is formed a roughened surface of a roughly constant specified roughness by comparison with the case of surface processing by another method as the blasting. With this arrangement, the features of the roughened surface can be stably put into effect regardless of the difference in position of the upper surface 5a of the work stage 5 and the difference of the working apparatus, allowing the work and quality to be stabilized. A roughened surface condition suitable for the work object to be handled can be stably ensured.

Electric discharge machining shown in FIG. 7 uses a copper-made electrode 71 that has a length corresponding to the width of the upper surface 5a of the work stage 5 as well as a shape and dimensions as shown in the figure. An effective roughened surface can be obtained with the specifications of a gap of 20 $\mu$m with respect to the upper surface 5a, an electric discharge machining speed of 0.7 mm$^3$/min and a voltage of 70 V. A thin face results when a discharge pulse width is small and quiescent pulse width is great. The smaller the current wave value is, the thinner the surface results. By controlling these specifications, the degree of surface roughness of the work 5a of the work stage 5 can be freely adjusted. The hardness of the work stage 5 made of stainless steel is, for example, 55 degrees to 62 degrees (Rockwell C-scale, HRC). An effective result could be obtained even singly with the roughened surface for IC chips 1 of both silicon and gallium arsenide at a surface roughness of 3 to 30 $\mu$m as the aforementioned one example. It is preferable to increase the degree of surface roughness as the IC chip 1 becomes small and lightweight, for the sake of easiness in preventing unprepared movement. Therefore, the surface roughness within the range of 3 to 30 $\mu$m should properly be selectively set in correspondence with the chip size ranging from a small IC chip 1 to a large IC chip 1.

The work stage 5 is mounted so as to be replaceable by screws 81 on a block 35a that has a heater 9 and is provided on a support leg 35. With this arrangement, the maintenance work required for a change due to the wearing of the roughened surface state and the work of replacing the work stage with a work stage 3 that has a roughened surface corresponding to the type of the IC chip every time the IC chip is changed can be achieved on optimum conditions, which is preferable.

The thus-obtained IC chip 1 provided with bumps serving as the product 82 that has undergone the bump bonding work comes to have no visible scratch on its surface 1b opposite from the mounting surface 1a on which a metal bump 4 is wire-bonded onto the electrode 2 and is easily stably obtained by the aforementioned working method and working apparatus. This also eliminates the occurrence of visible scratches on the surface to be noticed not only in the electronic component state but also after the mounting of the component on a circuit board and assembled into equipment as well as the causes of scratches, chipping and cracking due to impact or the like during handling or the like, and therefore, high reliability can be ensured. It is to be noted that the visible scratch has a dimension of, for example, not smaller than 0.2 $\mu$m. However, without being limited to this, the dimension should be set again according to the review of criteria if it is done.

As is apparent from the above description, the present invention prevents the occurrence of scratches, chipping and cracking on the surface that belongs to the work object such as an IC chip and is put in contact with the work stage during the handling of work, allowing the quality and yield of the products to be improved.

(Second Embodiment)

The second embodiment of the present invention will be described in detail next with reference to the drawings.

This second embodiment largely differs from the first embodiment in that neither the first suction hole C11a communicating with the first vacuum pump 11 nor the second suction hole C11b communicating with the second vacuum pump 12 is provided and that a suction force control section for controlling the suction force of the electronic component 1 such as an IC chip that serves as an example of the work object on the work stage 5 at two levels of strong and weak is arranged between the work stage 5 and the vacuum pump.

Figure 8A:
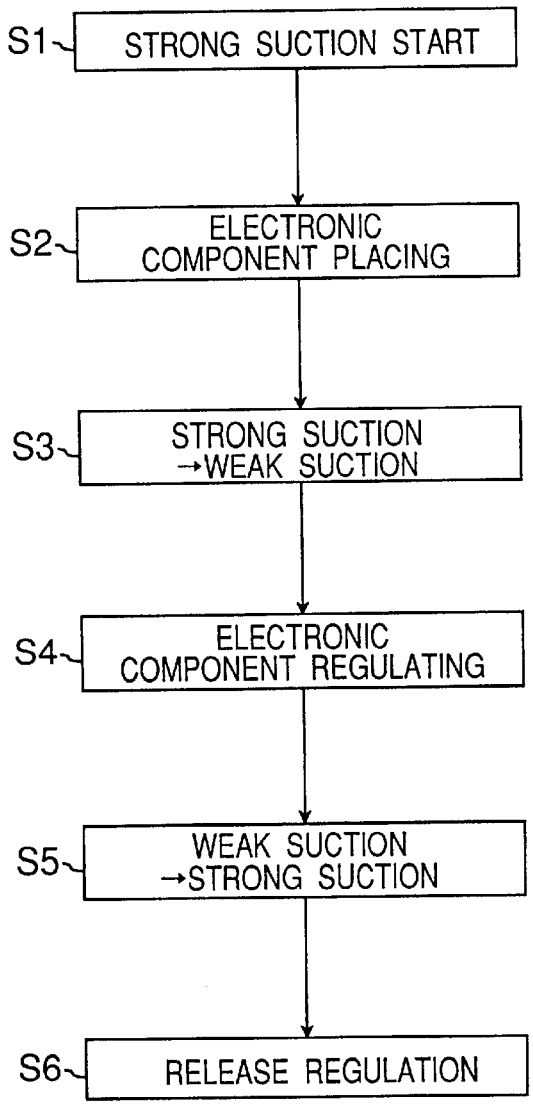
FIGS. 8A, 8B, 8C and 8D are diagrams of a flowchart and schematic explanatory views of operation when an electronic component is regulated in position by a bump bonding apparatus and method according to a second embodiment of the present invention.
Figure 8B:
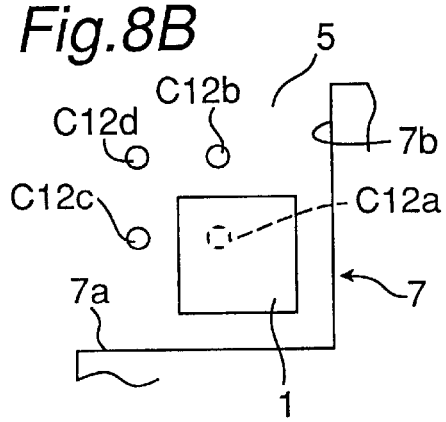
Figure 8C:
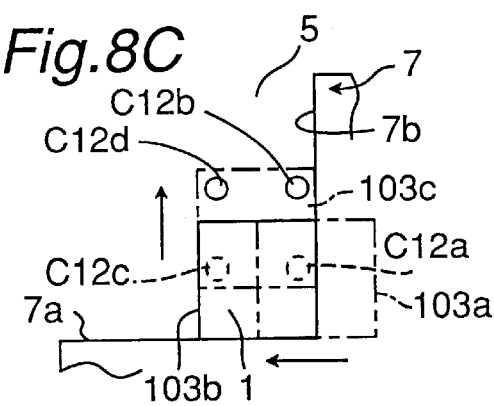
Figure 8D:
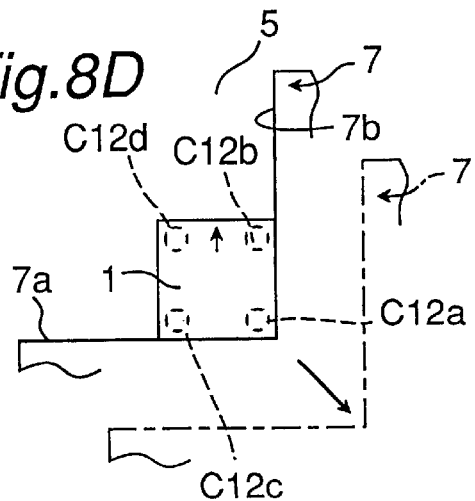
Figure 9:
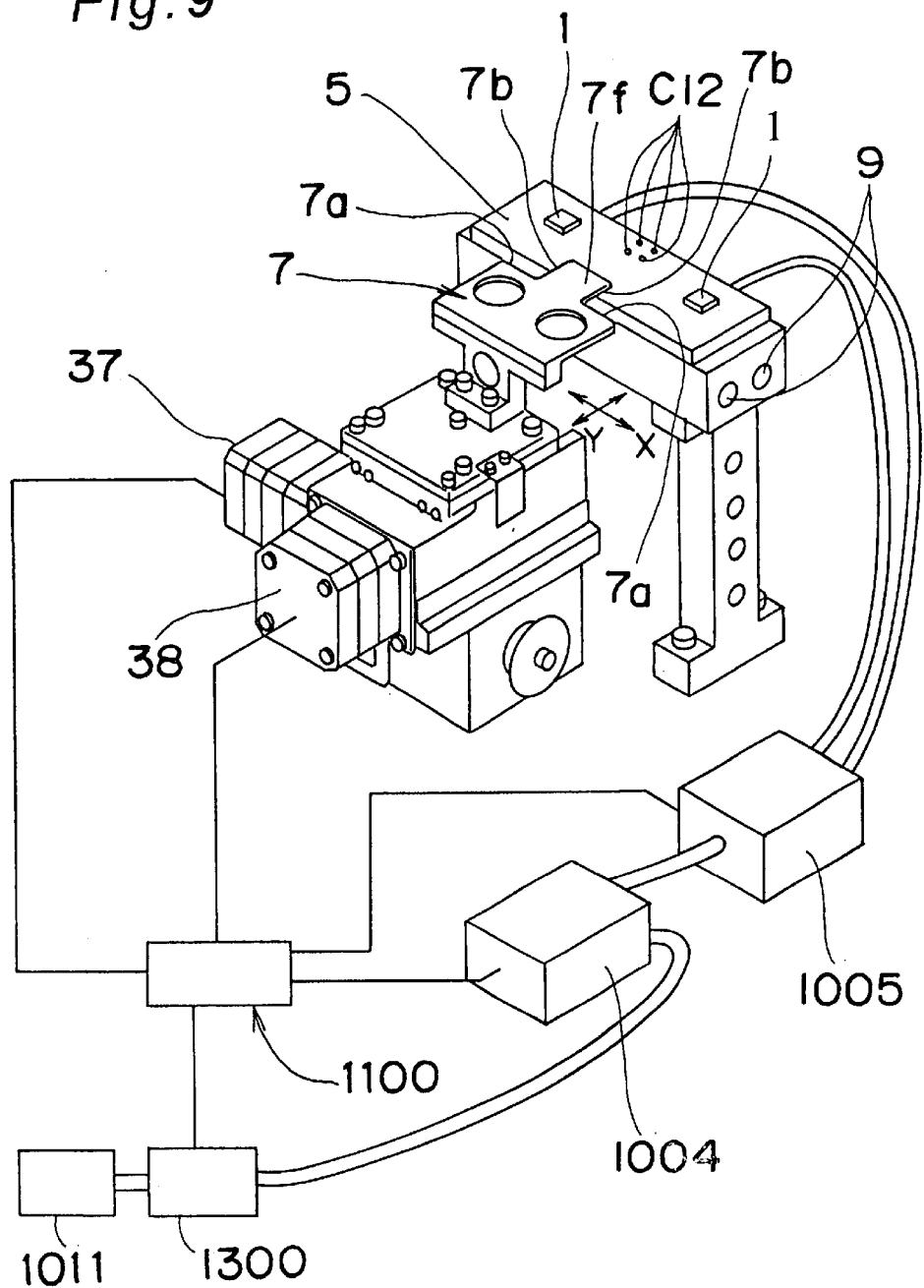
FIG. 9 is a perspective view of a position regulating section of the bump bonding apparatus of the second embodiment of the present invention.

FIGS. 8A, 8B, 8C and 8D are diagrams of a flowchart and schematic explanatory views of operation when an electronic component such as a semiconductor component is regulated in position by a bump bonding apparatus and method according to the second embodiment of the present invention, while FIG. 9 is a perspective view of the position regulating section of the above bump bonding apparatus.

Referring to FIG. 9, reference numeral 5 denotes a work stage having four suction holes C12, i.e., C12a, C12b, C12C and C12d, which are located in spots in, for example, a square form and operates to place the electronic component 1 and fix the position of the electronic component 1 by holding by suction the electronic component 1. The work stage 5 has a built-in heater 9 for heating the electronic component 1 to a bump bonding temperature (about 350° C., for example) for the bump bonding of the electronic component 1. Reference numeral 1004 denotes a vacuum pump that serves as an example of the suction device for attracting by suction the electronic component 1 to the stage 5 by utilizing the four suction holes C12a, C12b, C12c and C12d and is connected to the stage 5. A suction force control section 1005 constituting part of the control means 1100 exists between the stage 5 and the vacuum pump 1004, and the force of sucking the electronic component 1 onto the stage 5 can be controlled at two levels of strong and weak. That is, the suction force control section 1005 executes control by switching the suction force in sucking, for example, the electronic component 1 onto the stage 5 through the suction holes C12a, C12b, C12c and C12d on the stage 5 between at least two types of a first suction force, i.e., a weak suction force for holding by suction the electronic component 1 in a state in which the component can move along the stage 5 on the stage 5 and a second suction force, i.e., a strong suction force for holding and fixing by suction the electronic component 1 in a state in which the component cannot move along the stage 5 on the stage 5, the second suction force being stronger than the first suction force. Reference numeral 2 denotes a position regulating pawl that serves as an example of the position regulating member for positioning the electronic component 1. Position regulating edges 7a and 7b extending in the X-direction and the Y-direction are provided on both sides of a roughly T-figured position regulating head section 7f, and the position regulating head section 7f is made movable on the stage 5 in the two directions of XY-directions that are perpendicular to each other by driving an X-direction motor 37 and a Y-direction motor 38. Reference numeral 1100 denotes control means for controlling the operations of electronic component suction operation, suction releasing operation and moving operation of an electronic component conveyance device of, for example, a suction collet 1011, control operation of the suction force control section 1005, operation of turning on and off the vacuum pumps 1004 and operation of driving the X-direction motor 37 and the Y-direction motor 38 of the position regulating pawl 7. Normally, the pump 1004 is kept turned on, and for example, as shown by way of example in FIG. 9, a valve 1300 is arranged between the pump 1004 and the suction collet 1011, and the valve 1300 is controlled by the control means 1100 so as to switch the suction force. It is to be noted that the pump 1004 is also turned off under the control of the control means 1100 when the entire equipment is turned off.

The position regulating process of the electronic component by the aforementioned bump bonding apparatus and method will be described next with reference to FIG. 8A.

First of all, strong suction is effected (the strong suction force is put into effect) by means of the four suction holes C12a, C12b, C12c and C12d on the stage 5 by the suction force control section 1005 under the control of the control operation of the control means 1100 in step S1.

Figure 14:
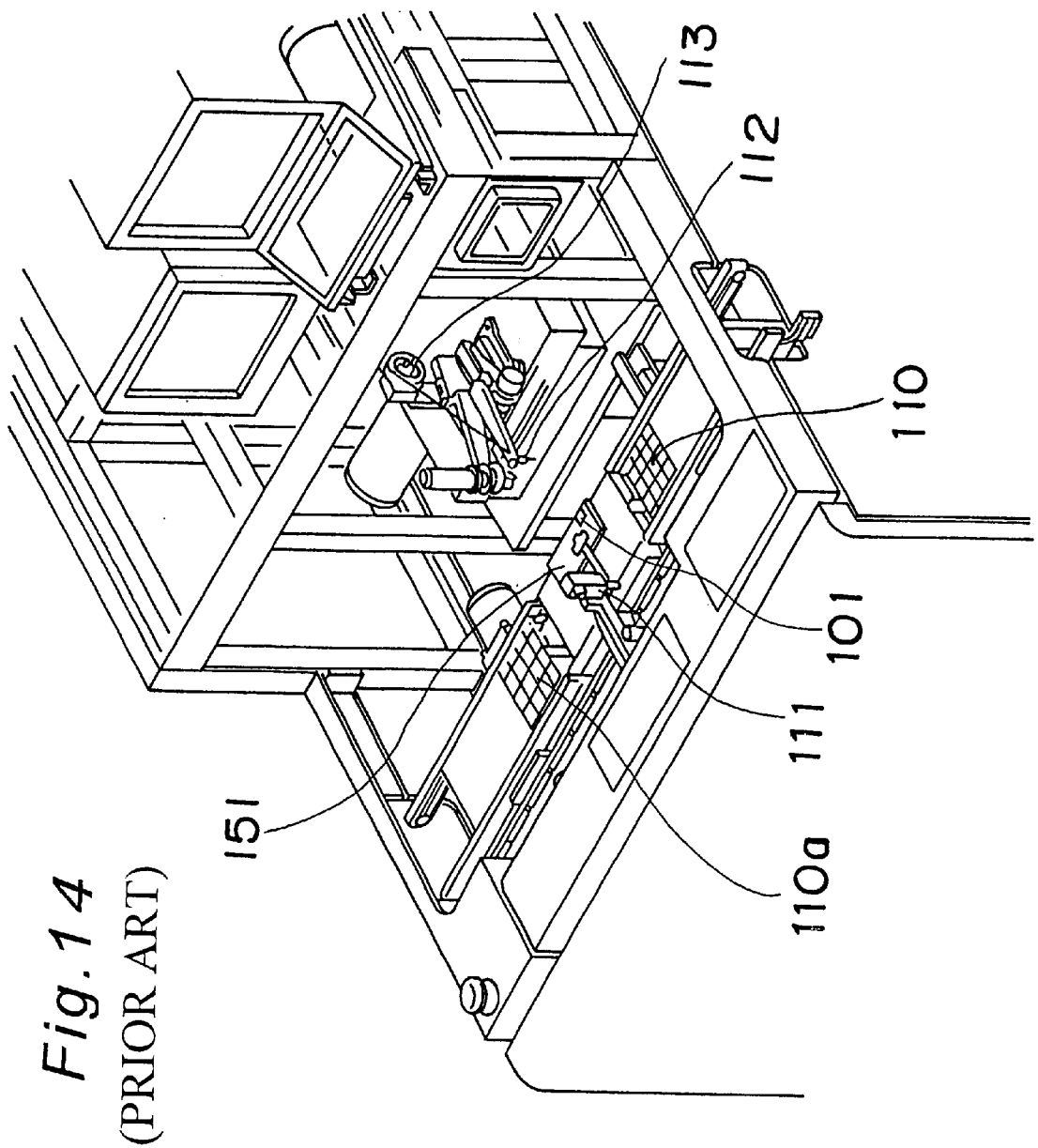
FIG. 14 is a perspective view showing the above conventional bump bonding apparatus.
Figure 15A:
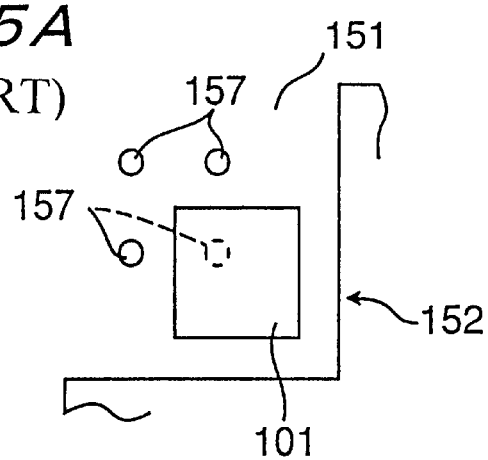
FIGS. 15A, 15B and 15C are views showing a bump bonding process illustrating bump formation by the above conventional bump bonding apparatus.
Figure 15B:
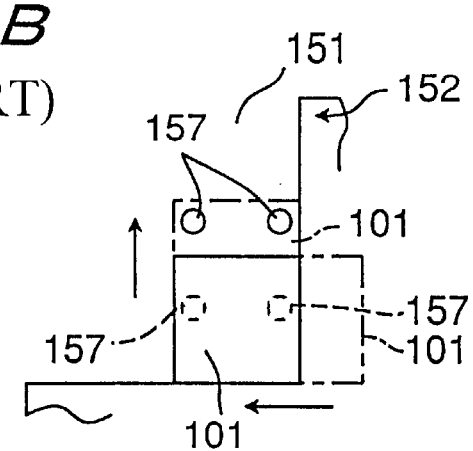
Figure 15C:
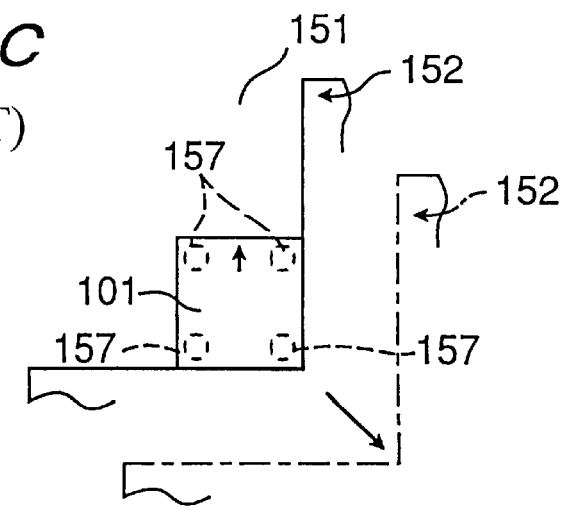

Next, after confirming the end of operation of step S1 by the control means 1100 upon receiving a signal from the suction force control section 1005 or a similar event, only one electronic component 1 put in the tray 110 is held by suction and conveyed to the stage 5 by means of the suction collet 1011 similar to the conventional one shown in FIG. 14 by the control operation of the control means 1100 in step S2, and the electronic component 1 is placed on the stage 5 by releasing the suction. The electronic component 1 is sucked with the strong suction force by the suction holes C12a, C12b, C12c and C12d of the stage 5, putting the electronic component 1 into the immovable state (see FIG. 8B). In FIG. 8B, the electronic component 1 is sucked to the stage 5 by the strong suction force only by the one lower-right suction hole C12a of the four suction holes C12a, C12b, C12c and C12d, putting the electronic component 1 into the immovable state.

Subsequently, the end of operation of step S2 is confirmed by the control means 1100 on the basis of a change in the suction force or the like by the suction collet 1011, and thereafter, the suction force of the four suction holes C12a, C12b, C12c and C12d is changed from the strong suction force to the weak suction force by the suction force control section 1005 under the control of the control means 1100 in step S3. In this case, the strong suction force means a suction force of such a degree that the electronic component 1 is loaded with a heavy load when the electronic component 1 attempts to move in a slide motion on the stage 5, possibly causing damage. As a concrete example, the suction force is set to a degree of vacuum of about −30 kPa when the suction is achieved by one suction hole C12a and set to a degree of vacuum of about −60 kPa when the suction is achieved by the four suction holes C12a, C12b, C12c and C12d. The weak suction force means a suction force of such a degree that the electronic component 1 can easily be slid on the stage 5 and the component does not easily separate from the IC chip placement surface of the stage 5, i.e., the electronic component 1 can be put into the movable state. As a concrete example, the suction force is set to a degree of vacuum of about −12 kPa when the suction is achieved by one suction hole C12a and set to a degree of vacuum of about −20 kPa when the suction is achieved by the four suction holes C12a, C12b, C12c and C12d.

Subsequently, the end of operation of step S3 is confirmed by the control means 1100 upon receiving a switching signal from the suction force control section 1005 or a similar event, and thereafter, the electronic component 1 is held by suction with the weak suction force on the stage 5 by the control operation of the control means 1100 putting the electronic component 1 into the movable state in Step S4, while the X-direction motor 37 and the Y-direction motor 38 are driven to position the electronic component 1 by the position regulating pawl 7 for the achievement of positional regulation. That is, concretely in, for example, FIG. 8C, the edge 7b in the vertical direction (corresponding to the Y-direction in FIG. 9) of the position regulating pawl 7 is made to abut against the electronic component 1 positioned in a position indicated by one-dot chain lines 103a by moving the position regulating pawl 7, and thereafter, the position regulating pawl 7 is moved in the leftward direction (corresponding to one direction along the X-direction in FIG. 9) to move the electronic component 1 leftward together with the position regulating pawl 7. The electronic component 1 is moved to a position 103b whose X-direction coordinate is roughly identical to that of a specified positionwherethe electronic component 1 should be positioned, and the electronic component 1 is held by suction with the weak suction force by means of the two suction holes C12a and C12c. Subsequently, by moving the position regulating pawl 7 in the upward direction (corresponding to one direction along the Y-direction in FIG. 9) with the edge 7a in the lateral direction (corresponding to the X-direction in FIG. 9) of the position regulating pawl 7 made to abut against the electronic component 1, the electronic component 1 is moved and positioned in a specified position 103c, and the electronic component 1 is held by suction with the weak suction force by means of the four suction holes C12a, C12b, C12c and C12d in the specified position 103c.

It is acceptable to make the lateral edge 7a of the position regulating pawl 7 abut against the electronic component 1 concurrently when the vertical edge 7b of the position regulating pawl 7 is first made to abut against the electronic component 1. It is also acceptable to move the lateral edge 7a of the position regulating pawl 7 in the vertical direction, i.e., the Y-direction by firstly making the lateral edge 7a abut against the electronic component 1 and thereafter move the vertical edge 7b of the position regulating pawl 7 in the lateral direction, i.e., the X-direction by making the vertical edge 7b abut against the electronic component.

Subsequently, the end of operation of step S4 is confirmed by the control means 1100 on the basis of a change in the suction force or the like of the four suction holes C12a, C12b, C12c and C12d, and thereafter, the positioning is achieved in Step S5, as shown in FIG. 8D. Thereafter, the suction force of the four suction holes C12a, C12b, C12c and C12d is switched from the weak suction force to the strong suction force by the suction force control section 1005, holding by suction the electronic component 1 in the immovable state on the stage 5. The bonding of the electronic component 1 is enabled in this state. However, normally, as shown in FIG. 8D, the positional regulation of the electronic component 1 achieved by the position regulating pawl 7 is released by moving the position regulating pawl 7 from the position of the solid lines to the position of the one-dot chain lines (Step S6).

Subsequently, the electronic component 1 positioned as described above is subjected to the known bonding operation.

According to the second embodiment, the suction force of the suction holes C12a, C12b, C12c and C12d of the stage 5 is thus increased when transporting the electronic component 1 from the suction collet 1011 to the stage 5, allowing the transport of the electronic component 1 from the electronic component conveyance apparatus of, for example, the suction collet 1011 to the stage 5 to be reliably performed. Thereafter, the suction force of the suction holes C12a, C12b, C12c and C12d of the stage 5 is reduced when performing the positional regulation of the electronic component 1 on the stage 5, making the electronic component 1 easy to move on the stage 5. When holding the electronic component 1 on the stage 5 after positional regulation, the suction force of the suction holes C12a, C12b, C12c and C12d of the stage 5 is increased, allowing the electronic component 1 to be securely held on the stage 5. Therefore, by properly switching the suction force between the strong level and the weak level according to the positioning operation and the holding operation, the occurrence of inclination and dislocation of the electronic component 1 due to the transport of the electronic component 1 from the suction collet 1011 to the stage 5 is eliminated. During the positional regulation, the frictional force and load between the position regulating member of, for example, the position regulating pawl 7 and the stage 5 and the electronic component 1 are reduced, by which the damage of the electronic component 1 is prevented. After the positioning, defective bumping such as non-bonded bump can be reduced by reliably performing the position holding.

If a heater 9 is provided inside the stage 5 to enable the application of heat to the electronic component 1, then the arrangement is effective for the subsequent bonding process.

(Third Embodiment)

Figure 10A:
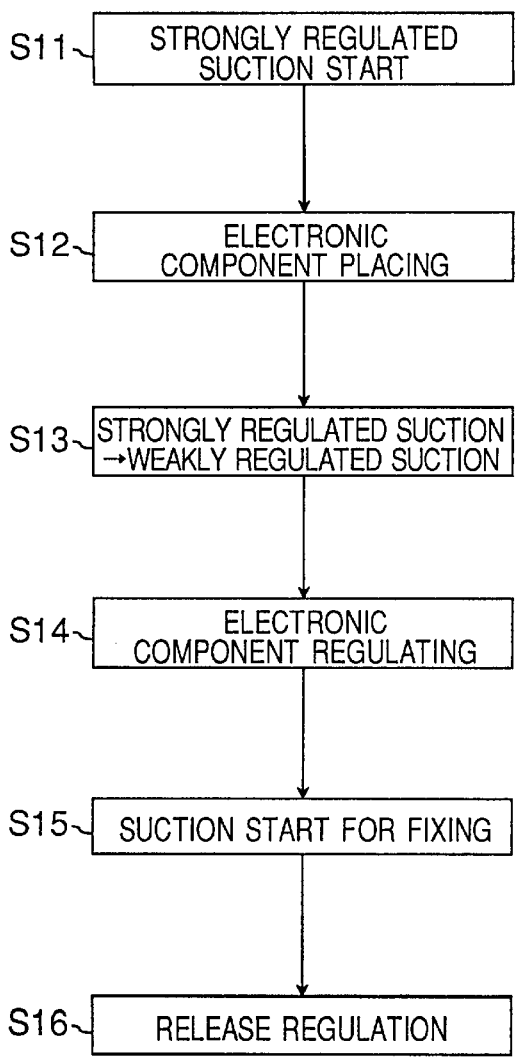
FIGS. 10A, 10B, 10C and 10D are diagrams of a flowchart and schematic explanatory views of operation when an electronic component is regulated in position by a bump bonding apparatus and method according to a third embodiment t of the present invention.
Figure 10B:
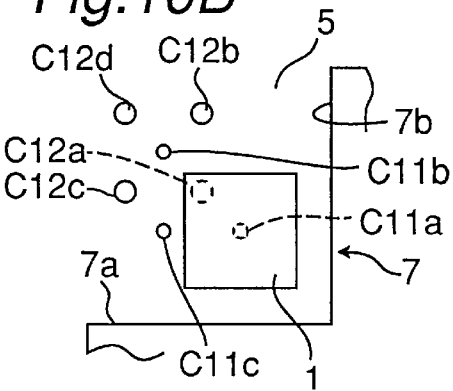
Figure 10C:
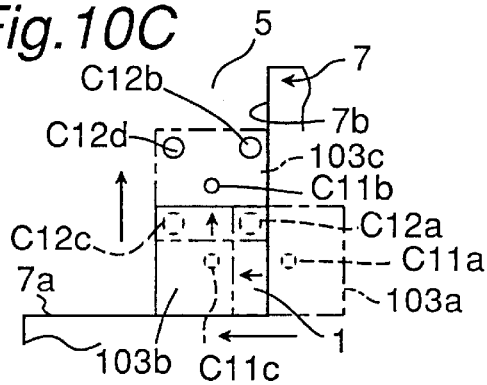

FIGS. 10A, 10B, 10C and 10D are diagrams of a flowchart and schematic explanatory views of operation when an electronic component is regulated in position by a bump bonding apparatus and method according to the third embodiment of the present invention. FIG. 11 is a perspective view of a position regulating section of the bump bonding apparatus of the above third embodiment.

Regarding the description of the construction of the position regulating section of the aforementioned bump bonding apparatus and method, the part similar to that of the second embodiment is eliminated. The point different from the second embodiment is that the suction hole of the stage 5 is separated into the two types of position regulating suction holes C11a, C11b and C11c and position fixing suction holes C12a, C12b, C12c and C12d, two vacuum pumps 11 and 12 are arranged in correspondence with the two types of suction holes C11a, C11b, C11c, C12a, C12b, C12c and C12d, and a position regulating suction force control section 22 is arranged on the position regulating suction holes C11a, C11b and C11c side. In the position regulating operation, the electronic component 1 is movably held for positional regulation by the sucking operation of, for example, the three position regulating suction holes C11a, C11b and C11c located in spots in a roughly L-figured shape under the control of the position regulating suction force control section 22. In the fixing operation, the electronic component 1 is immovably held by the sucking operation of, for example, the four position fixing suction holes C12a, C12b, C12c and C12d located in spots in, for example, a square shape.

This third embodiment largely differs from the first embodiment in that the suction force for the suction to the stage 5 through the position regulating suction holes C11a, C11b and C11c can be switched between two levels of strong and weak.

The position regulating suction force control section 22 executes control by switching the suction force in sucking, for example, the electronic component 1 onto the stage 5 through the position regulating suction holes C11a, C11b and C11c on the stage 5 between at least two types of a first suction force, i.e., a weak suction force for holding by suction the electronic component 1 in a state in which the component can slidably move along the stage 5 on the stage 5 and a second suction force, i.e., a strong suction force for holding and fixing by suction the electronic component 1 in a state in which the component cannot move along the stage 5 on the stage 5, the second suction force being stronger than the first suction force.

In FIG. 11, reference numeral 1200 denotes a control section, which controls the operations of electronic component suction operation, suction releasing operation and moving operation of a suction collet 1011, control operation of the position regulating suction force control section 22, operation of turning on and off the two vacuum pumps 11 and 12 and operation of driving the X-direction motor 37 and the Y-direction motor 38 of the position regulating pawl 7. Normally, the pump 12 is kept turned on, and for example, as shown by way of example in FIG. 11, a valve 1301 is arranged between the pump 12 and the suction collet 1011, and the valve 1301 is controlled by the control section 1200 so as to switch the suction force. It is to be noted that the pump 12 is also turned off under the control of the control section 1200 when the entire equipment is turned off.

The position regulating process of the electronic component by the aforementioned bump bonding apparatus and method will be described next with reference to FIG. 10A.

First of all, a strong position regulating suction force (strong suction force) is applied to, for example, the three position regulating suction holes C11a, C11b and C11c by the position regulating suction force control section 22 under the control of the control operation of the control section 1200 in step S11.

Next, after confirming the end of operation of step S11 by the control section 1200 upon receiving a signal from the position regulating suction force control section 22 or a similar event, only one electronic component 1 put in the tray 110 is held by suction and conveyed to the stage 5 by means of the suction collet 1011 similar to the conventional one shown in FIG. 14 by the control operation of the control section 1200 in step S12, and the electronic component 1 is placed on the stage 5 by releasing the suction. The component is sucked with the strong suction force by the position regulating suction holes C11a, C11b and C11c. of the stage 5 (see FIG. 10B). In FIG. 10B, the electronic component 1 is sucked to the stage 5 by the strong suction force by the one lower-right suction hole position regulating suction holes C11a, C11b of the three position regulating suction holes C11a, C11b and C11c.

Subsequently, the end of operation of step S12 is confirmed by the control section 1200 on the basis of a change in the suction force or the like by the suction collet 1011, and thereafter, the suction force of the three position regulating suction holes C11a, C11b and C11c is changed from the strong suction force to the weak suction force by the position regulating suction force control section 22 under the control of the control section 1200 in step S13. In this case, the strong suction force means a suction force of such a degree that the electronic component 1 is loaded with a heavy load when the electronic component 1 attempts to move in a slide motion on the stage 5, possibly causing damage. As a concrete example, the suction force is set to a degree of vacuum of about −30 kPa when the suction is achieved by any one of the position regulating suction holes C11a, C11b and C11c and set to a degree of vacuum of about −60 kPa when the suction is achieved by the three position regulating suction holes C11a, C11b and C11c. The weak suction force means a suction force of such a degree that the electronic component 1 can easily be slid on the stage 5 and the component does not easily separate from the upper surface of the stage 5. As a specific example, the suction force is set to a degree of vacuum of about −12 kPa when the suction is achieved by any one of the position regulating suction holes C11a, C11b and C11c and set to a degree of vacuum of about −20 kPa when the suction is achieved by the three position regulating suction holes C11a, C11b and C11c.

Subsequently, the end of operation of step S13 is confirmed by the component 120 upon receiving a switching signal from the position regulating suction force control section 22 or a similar event, and thereafter, the electronic component 1 is held by suction with the weak suction force on the stage 5 by the control operation of the control section 1200 in Step S14, while the X-direction motor 37 and the Y-direction motor 38 are driven to position the electronic component 1 by the position regulating pawl 7 for the achievement of positional regulation. That is, for example, in FIG. 10C, the edge 7b in the vertical direction (corresponding to the Y-direction in FIG. 11) of the position regulating pawl 7 is made to move into a position indicated by one-dot chain lines 103a by moving the position regulating pawl 7 and abut against the electronic component 1 held by suction with the weak suction force by means of the lower-right position regulating suction hole C11a, and thereafter, the position regulating pawl 7 is moved in the leftward direction (corresponding to one direction along the X-direction in FIG. 11) to move the electronic component 1 leftward into a position 103b whose X-direction coordinate is roughly identical to that of a specified position where the electronic component 1 should be positioned, holding by suction the electronic component 1 with the weak suction force by means of the lower-left position regulating suction hole C11c. Subsequently, by moving the position regulating pawl 7 in the upward direction (corresponding to one direction along the Y-direction in FIG. 11) with the edge 7a in the lateral direction (corresponding to the X-direction in FIG. 11) of the position regulating pawl 7 made to abut against the electronic component 1, the electronic component 1 is moved and positioned in a specified position 103c, and the electronic component 1 is held by suction with the weak suction force by means of the upper-left position regulating suction hole C11b in the specified position 103c. In these operations, the electronic component 1 is held movable for positional regulation with the approximate center portion of the electronic component 1 sucked with the weak suction force each time by one of the position regulating suction hole C11 of the three position regulating suction holes C11a, C11b and C11c in the positions 103a, 103b and 103c.

It is acceptable to make the lateral edge 7a of the position regulating pawl 7 abut against the electronic component 1 concurrently when the vertical edge 7b of the position regulating pawl 7 is first made to abut against the electronic component 1. It is also acceptable to move the lateral edge 7a of the position regulating pawl 7 in the vertical direction, i.e., the Y-direction by firstly making the lateral edge 7a of the position regulating pawl 7 abut against the electronic component 1 and thereafter move the vertical edge 7b of the position regulating pawl 7 in the lateral direction, i.e., the X-direction by making the vertical edge 7b abut against the electronic component.

Figure 10D:
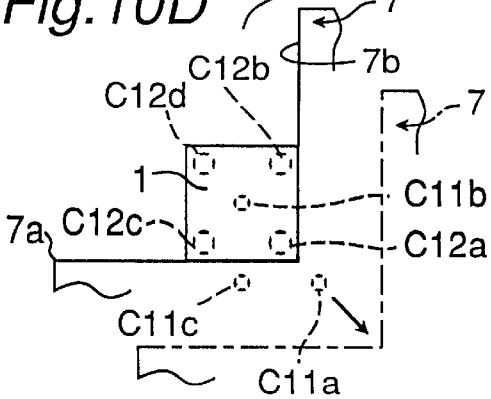
Figure 11:
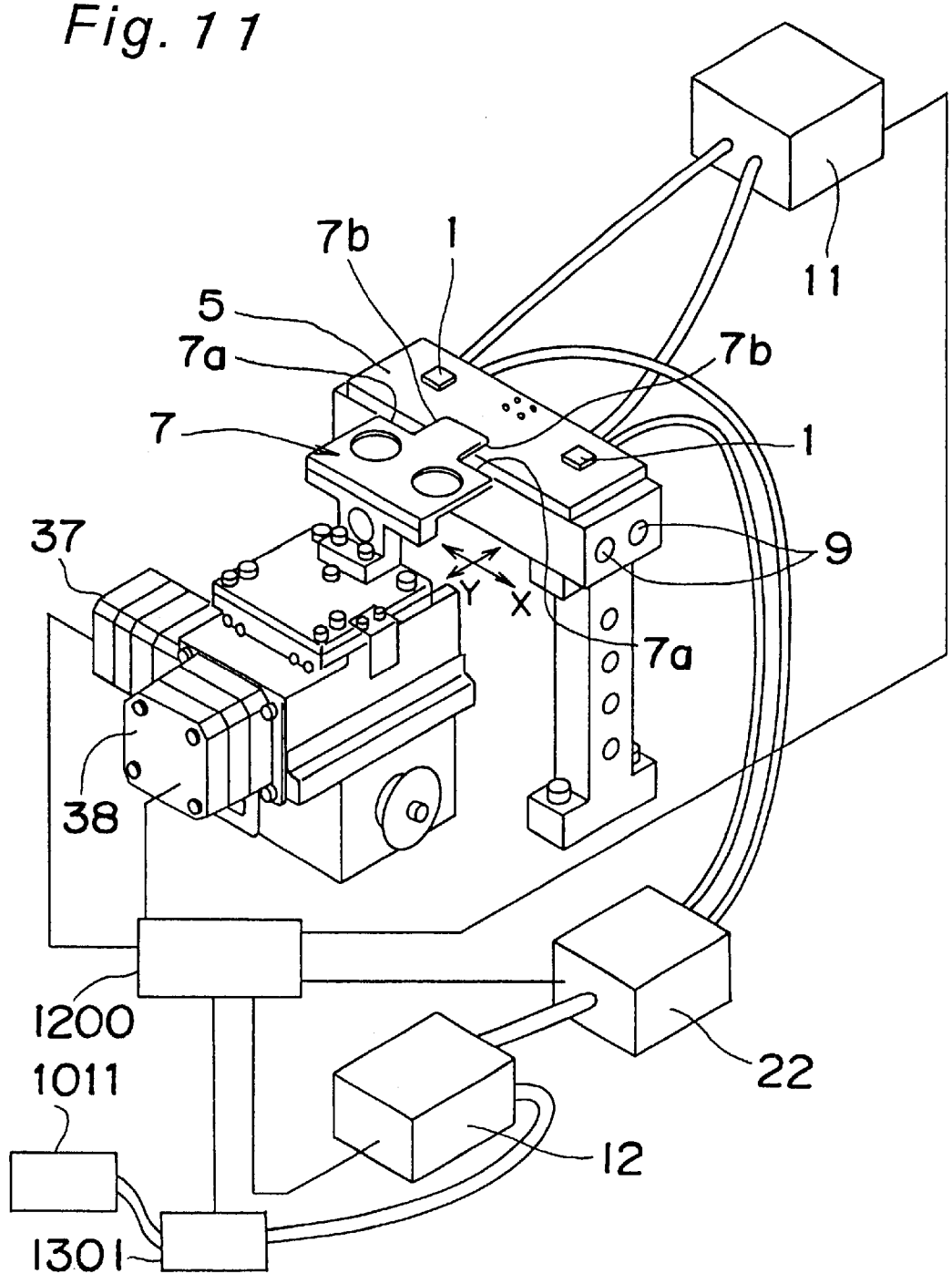
FIG. 11 is a perspective view of a position regulating section of the bump bonding apparatus of the third embodiment of the present invention.

Subsequently, the end of operation of step S14 is confirmed by the control section 1200 on the basis of a change in the suction force or the like of the upper-left position regulating suction holes C11a, C11b and C11c, and thereafter, the positioning is achieved in Step S15, as shown in FIG. 10D. Thereafter, the suction from the first vacuum pump 11 is started by opening the valve 1301 concurrently with or prior to the stop of suction by the position regulating suction holes C11a, C11b and C11c under the control of the position regulating control section 22 by the control operation of the control section 1200, by which the electronic component 1 is fixed by suction in the immovable state by the four position fixing suction holes C12a, C12b, C12c and C12d. The bonding of the electronic component 1 is enabled in this state. However, normally, as shown in FIG. 10D, the positional regulation of the electronic component 1 achieved by the position regulating pawl 7 is released by moving the position regulating pawl 7 from the position of the solid lines to the position of the one-dot chain lines (Step S16).

Subsequently, the electronic component 1 positioned as described above is subjected to the known bonding operation.

Figure 12:
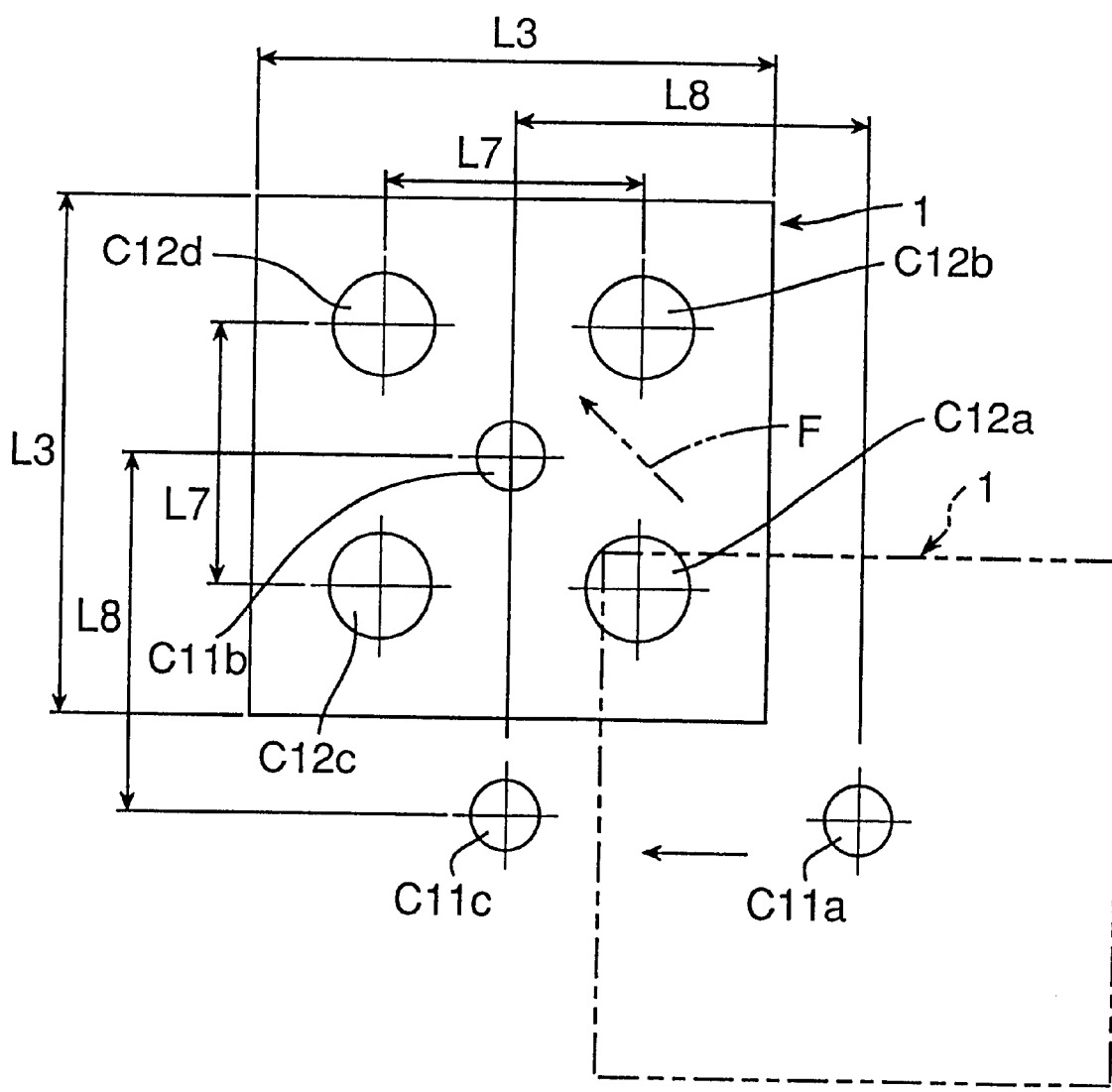
FIG. 12 is a view showing position fixing suction holes, position regulating suction holes and an electronic component according to an embodiment of the bump bonding apparatus of the third embodiment of the present invention.
Figure 13:
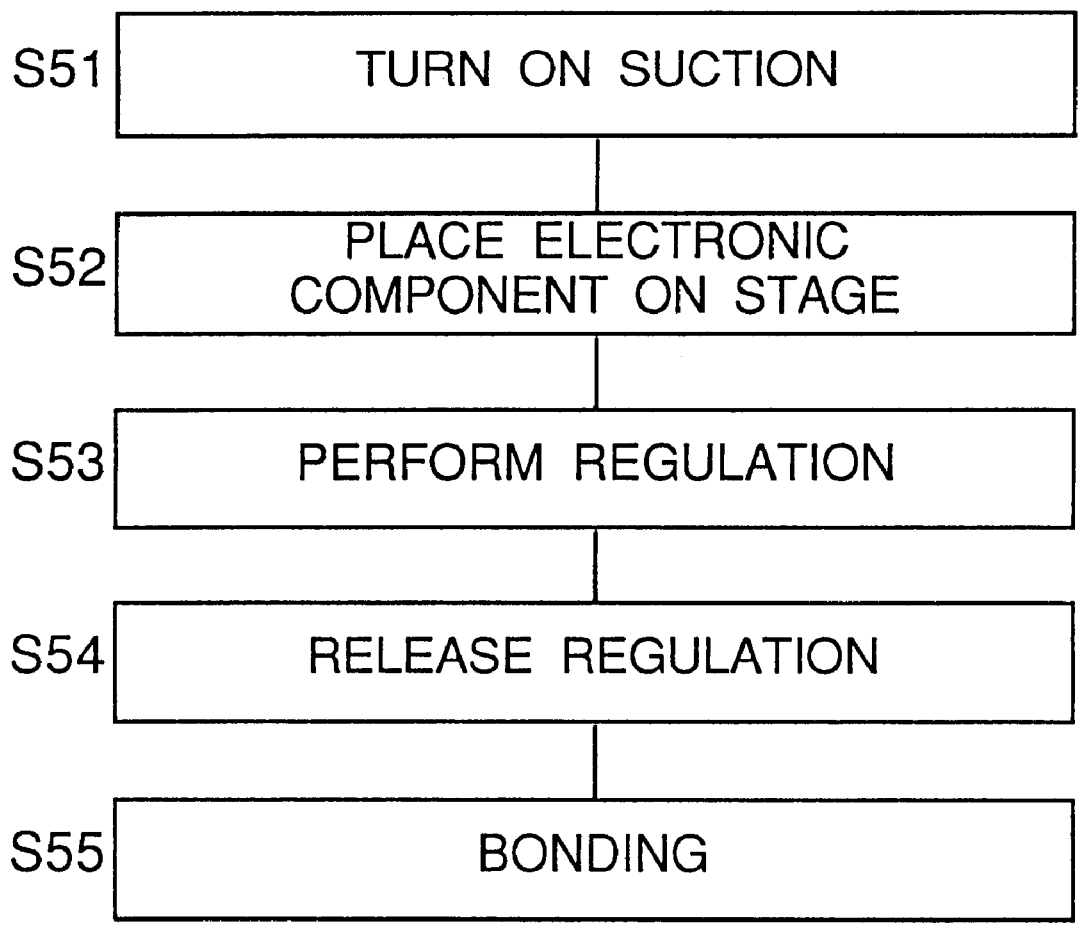
FIG. 13 is a flowchart showing a conventional working method.

According to the third embodiment, the suction force of the position regulating suction holes C11a, C11b and C11c of the stage 5 is thus increased when the electronic component 1 is transported from the electronic component conveyance device of, for example, the suction collet 1011 to the stage 5 for suction with the strong suction force, allowing the transport of the electronic component 1 from the suction collet 1011 to the stage 5 to be reliably performed. Subsequently, the suction force of the position regulating suction holes C11a, C11b and C11c of the stage 5 is set to the weak suction force when the electronic component 1 is regulated in position on the stage 5, making the electronic component 1 easy to move on the stage 5. After the positional regulation, the electronic component 1 can be securely held on the stage 5 with the strong suction force of the position fixing suction holes C12a, C12b, C12c and C12d of the stage 5 when the electronic component 1 is held on the stage 5. Therefore, by properly selectively using the suction for positional regulation capable of properly switching the suction between the strong level and the weak level according to the positioning operation and the holding operation and the suction for fixation for merely immovably fixing and holding the electronic component 1, the occurrence of inclination and dislocation of the electronic component 1 due to the transport of the electronic component 1 from the suction collet 1011 to the stage 5 is eliminated. During the positional regulation, the frictional force and load between the position regulating member of, for example, the position regulating pawl 7 and the stage 5 and the electronic component 1 are reduced, by which the damage of the electronic component 1 is prevented. After the positioning, defective bumping such as non-bonded bump can be reduced by reliably performing the position holding. That is, with only the four position fixing suction holes C12a, C12b, C12c and C12d, the electronic component 1 tends to flow in the direction of arrow indicated by the one-dot chain line when the electronic component 1 indicated by the two-dot chain lines in FIG. 12 is sucked by only the lower-right position fixing suction hole C12a out of the four position fixing suction holes C12a, C12b, C12c and C12d. However, as in the third embodiment, provided with the position regulating suction holes C11a, C11b and C11c located outside the range in which the suction can be achieved by the four position fixing suction holes C12a, C12b, C12c and C12d, the electronic component 1 indicated by the two-dot chain lines in FIG. 12 is sucked by not only the lower-right position fixing suction holes C12a, C12b, C12c and C12d but also the lower-right position regulating suction hole C11a. Therefore, the electronic component 1 becomes hard to flow in the direction of arrow indicated by the one-dot chain line F.

If a heater 9 is provided inside the stage 5 to enable the application of heat (350° C., for example) to the electronic component 1, then the arrangement is effective for the subsequent bonding process.

In the third embodiment, as an example, the strong suction force for positional regulation provided by the position regulating suction holes C11a, C11b and C11c is made approximately equal to the suction force for fixation provided by the position fixing suction holes C12a, C12b, C12c and C12d. Then, merely by reducing the suction force for positional regulation provided by the position regulating suction holes C11a, C11b and C11c when moving the electronic component 1, the transport of the electronic component 1 and the fixation of the electronic component 1 are performed with the strong suction force for positional regulation provided by the position regulating suction holes C11a, C11b and C11c. Although all the holes are closed when fixing the electronic component 1, there are some leak holes among all the holes when transporting the electronic component 1.

As an example of the third embodiment, as shown in FIG. 12, assuming that each of the three position regulating suction holes C11a, C11b and C11c has an inside diameter of 0.8 mm, each of the four position fixing suction holes C12a, C12b, C12c and C12d has an inside diameter of 1.2 mm, an interval L8 between adjoining ones of the position regulating suction holes C11a, C11b and C11c is 4 mm, an interval L7 between adjoining ones of the position fixing suction holes C12a, C12b, C12c and C12d is 2.8 mm and the chip serving as an example of the electronic component 1 to be sucked is a square having a side L3 of 6 mm, then the strong suction force for positional regulation when transporting one electronic component 1 by one position regulating suction hole C11 of the position regulating suction holes C11a, C11b and C11c is set to −30 kPa, the weak suction force for regulating in position the electronic component 1 is set to −12 kPa, and the suction force for positional fixation of the position fixing suction holes C12a, C12b, C12c and C12d when fixing in position the electronic component 1 by the four position fixing suction holes C12a, C12b, C12c and C12d is set to −60 kPa. However, without being limited to this embodiment, the forces may be varied according to the size of the electronic component 1 and the size, the number and so on of the position regulating suction holes C11a, C11b and C11c and the position fixing suction holes C12a, C12b, C12c and C12d.

It is to be noted that the present invention is limited to none of the aforementioned embodiments and is allowed to be put into practice in a variety of forms.

For example, the position regulating suction holes C11a, C11b and C11c of the third embodiment are arranged in the respective positions corresponding to the center portion of the electronic component 1 according to the track of positional regulation of the electronic component 1, i.e., in the positions of the positions 103a, 103b as described above, and the three position regulating suction holes C11a, C11b and C11c are arranged in the L-figured shape in the third embodiment. However, without being limited to this, the holes can be arranged in a variety of forms. The size and shape of the position regulating suction holes C11a, C11b and C11c, which have a round shape of a diameter of 0.8 mm in the third embodiment, may have other appropriate size and shape.

Although the vacuum pumps 11 and 12 are independently provided in the two pneumatic routes, they may be common, or a variety of vacuum generating means other than the pump can be utilized.

The bump bonding apparatus of the present invention is constructed of the stage having the suction hole for sucking and fixing in position the electronic component, the position regulating member for positioning the electronic component on the stage and the suction force control section capable of forcibly controlling the suction force in sucking the electronic component on the stage. This arrangement enables an increase in the suction force when placing the electronic component, a reduction in the suction force during positional regulation and an increase in the suction force after completing the positioning and eliminates the inclination and dislocation of the electronic component when the electronic component is placed on the stage. Moreover, with the above-mentioned arrangement, the frictional force and load of the position regulating member, the stage and the electronic component are reduced during the positional regulation. Therefore, the damage of the electronic component can be prevented and defective bumping such as non-bonded bump can be reduced after the positioning, giving solution to the conventional issues.

The bump bonding method of the present invention has the strong sucking process, the electronic component placing process, the process of switching from the strong suction to the weak suction, the electronic component position regulating process and the process of switching from the weak suction to the strong suction. Therefore, effects and operation similar to the effects and operation of the aforementioned bump bonding apparatus can be obtained.

The bump bonding apparatus of the present invention is constructed of the suction hole for sucking and fixing in position the electronic component, the stage having the position regulating suction hole for sucking the electronic component when regulating in position the electronic component, the position regulating member for positioning the electronic component on the stage and the position regulating suction force control section capable of controlling the position regulating suction force for regulating in position the electronic component on the stage at the weak and strong levels. Therefore, the effects and operation similar to those described above can be obtained regardless of the position, the size and the number of the position fixing suction holes.

The bump bonding method of the present invention has the strong position regulating suction process, the electronic component placing process, the process of switching from the strong position regulating suction to the weak position regulating suction, the process of regulating in position the electronic component and the process of fixing suction for fixing the electronic component. Therefore, effects and operation similar to those described above can be obtained.

If the heater is provided inside the stage to enable the application of heat (350° C., for example) to the electronic component, then the arrangement is effective for the subsequent bonding process.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A working method for holding by suction a work object placed on a work stage, moving the work object into a specified position, regulating in position the object, and thereafter subjecting the object to specified work, the working method comprising:

receiving the work object to be placed on a work object placement surface of a roughened surface of the work stage; holding by suction the work object while supporting the work object with protruding portions of the roughened surface of the work object placement surface of the work stage;

thereafter changing an immovable state in which the object is held by suction into a movable state for positional regulation; and thereafter regulating in position the work object while stably moving the work object on the work stage in a frictional state obtained by supporting the work object with the protruding portions of the roughened surface of the work object placement surface of the work stage and while restraining strong abrasive movement of a foreign object between the work stage and the work object in moving the work object for positional regulation by pockets that are formed of recess portions around the protruding portions and letting the foreign object escape.

2. A working method as claimed in claim 1, wherein the movable state for positional regulation is a state in which the suction of the work object is reduced or released.

3. A working method as claimed in claim 1, wherein the work object is regulated in position in the movable state for positional regulation, thereafter the work object is sucked again to put the work object into the immovable state, and thereafter, the work object is subjected to the specified work.

4. A working method as claimed in claim 1, wherein the specified work is performed after starting the suction of the work object in the immovable state by turning on a suction device exclusively for work and is set in correspondence with the work.

5. A working method as claimed in claim 1, wherein the work object is an IC chip, the positional regulation is performed with use of the work stage whose IC chip placement surface that serves as the work object placement surface is a roughened surface, the recess portions provided around the protruding portions of the roughened surface that serve as the work object placement surface form pockets for letting the foreign object escape to restrain influence of the foreign object exerted on the IC chip when bump bonding work is performed as the specified work with the IC chip subjected to heating to a bump bonding temperature of the bump bonding work, a pressure load, and a vibration load.

6. A working method as claimed in claim 1, wherein the work object is an IC chip and the specified work is a bump bonding work for applying heat to the IC chip from the work stage side, pressing a metal wire against an electrode of the IC chip with ultrasonic vibrations applied to the metal wire and thus achieving metallic bond, and forming a metal bump on the IC chip by separating a succeeding metal wire from a bonded metal lump formed through the processes.

7. A working method as claimed in claim 1, wherein the specified work is bump bonding, the work object is an electronic component, and a suction force for sucking the electronic component onto the work stage through a suction hole of the work stage that has the suction hole for holding by suction the electronic component is switched between at least two types of a first suction force with which the electronic component is held by suction to such an extent that the electronic component can move along the stage on the stage and a second suction force, which is stronger than the first suction force and with which the electronic component is held by suction to such an extent that the electronic component cannot move along the stage on the stage, the working method comprising:

a process for switching the suction force to the second suction force;

a process for placing the electronic component on the stage and holding by suction the electronic component with the second suction force through the suction hole of the stage;

a process for switching the suction force for sucking the electronic component to the stage through the suction hole of the stage from the second suction force to the first suction force;

a position regulating process for moving the electronic component by a position regulating member for positioning while holding by suction the electronic component with the first suction force on the stage;

a process for immovably holding by suction the positioned electronic component on the stage by switching the suction force from the first suction force to the second suction force; and a process for performing bump bonding that serves as the specified work.

8. A working method as claimed in claim 1, wherein heat is applied to the electronic component via the stage, to impart a bump bonding temperature to the electronic component.

9. A working method as claimed in claim 1, wherein the specified work is bump bonding, the work object is an electronic component, and a suction force for sucking the electronic component onto the stage through a position regulating suction hole of the work stage.

10. A working method for holding by suction a work object placed on a work stage, moving the work object into a specified position, regulating in position the object, and thereafter subjecting the object to specified work, the working method comprising:

receiving an IC chip that serves as the work object to be placed on an IC chip placement surface of a roughened surface of the work stage; holding by suction the IC chip while supporting the IC chip by protruding portions of the roughened surface of the IC chip placement surface of the work stage;

thereafter changing an immovable state in which the object is held by suction into a movable state for positional regulation; and thereafter providing pockets that are formed of recess portions provided around the protruding portions of the roughened surface serving as the IC chip placement surface and letting a foreign object escape to restrain influence of the foreign object exerted on the IC chip when bump bonding work is performed with the IC chip subjected to heating to a bump bonding temperature of the bump bonding work, a pressure load, and a vibration load.

* * * * *

UNITED STATES PATENT AND TRADEMARK OFFICE
CERTIFICATE OF CORRECTION

PATENT NO. : 6,619,535 B1
DATED : September 16, 2003
INVENTOR(S) : Makoto Imanishi et al.

It is certified that error appears in the above-identified patent and that said Letters Patent is hereby corrected as shown below:

<u>Title page,</u>
Item [57], ABSTRACT,
Line 3, please replace "and position" with -- and a position --.

<u>Column 33,</u>
Line 23, please replace "claim 1," with -- claim 7, --.

<u>Column 34,</u>
Line 2, please remove the "." at the end of the line and add --that has the position regulating suction hole for holding by suction the electronic component is switched between at least two types of a first suction force with which the electronic component is held by suction to such an extent that the electronic component can move along the stage on the stage and a second suction force, which is stronger than the first suction force and with which the electronic component is held by suction to such an extent that the electronic component cannot move along the stage on the stage, the working method comprising:

a process for switching the suction force to the second suction force;

a process for placing the electronic component on the stage and holding by suction the electronic component with the second suction force through the position regulating suction hole of the stage;

a process for switching the suction force for sucking the electronic component to the stage through the position regulating suction hole of the stage from the second suction force to the first suction force;

a position regulating process for moving the electronic component by a position regulating member for positioning while holding by suction the electronic component with the first suction force on the stage;

a process for immovably holding by suction the positioned electronic component on the stage by means of the position fixing suction hole of the stage; and a process for performing bump bonding that serves as the specified work.--.

Signed and Sealed this

Twenty-seventh Day of April, 2004

JON W. DUDAS
*Acting Director of the United States Patent and Trademark Office*